United States Patent
Lee et al.

(10) Patent No.: US 11,563,116 B2
(45) Date of Patent: Jan. 24, 2023

(54) VERTICAL TYPE TRANSISTOR, INVERTER INCLUDING THE SAME, AND VERTICAL TYPE SEMICONDUCTOR DEVICE INCLUDING THE SAME

(71) Applicant: Samsung Electronics Co., Ltd., Suwon-si (KR)

(72) Inventors: Minhyun Lee, Suwon-si (KR); Minsu Seol, Seoul (KR); Yeonchoo Cho, Seongnam-si (KR); Hyeonjin Shin, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 22 days.

(21) Appl. No.: 17/201,485

(22) Filed: Mar. 15, 2021

(65) Prior Publication Data

US 2021/0288171 A1 Sep. 16, 2021

(30) Foreign Application Priority Data

Mar. 16, 2020 (KR) .................. 10-2020-0032276
Dec. 15, 2020 (KR) .................. 10-2020-0175834

(51) Int. Cl.
*H01L 29/778* (2006.01)
*H01L 29/24* (2006.01)
(Continued)

(52) U.S. Cl.
CPC ........ *H01L 29/7788* (2013.01); *H01L 27/092* (2013.01); *H01L 29/24* (2013.01);
(Continued)

(58) Field of Classification Search
CPC ... H01L 29/7788; H01L 27/092; H01L 29/24; H01L 29/41741; H01L 29/7831;
(Continued)

(56) References Cited

U.S. PATENT DOCUMENTS 5,943,574 A * 8/1999 Tehrani ............... H01L 27/0922
257/E21.582
8,754,470 B1 6/2014 Chuang et al.
(Continued)

FOREIGN PATENT DOCUMENTS

EP 2963688 A2 * 1/2016 ......... H01L 29/0653
WO WO-2019/132886 A1 7/2019

OTHER PUBLICATIONS

N. Clement et al. "Electronic transport mechanisms in scaled gate-all-around silicon nanowire transistor arrays" Applied Physics Letters, 103, (2013).
(Continued)

*Primary Examiner* — Earl N Taylor
(74) *Attorney, Agent, or Firm* — Harness, Dickey & Pierce, P.L.C.

(57) ABSTRACT

A vertical type transistor includes: a substrate; a first source/drain electrode layer provided on the substrate; a second source/drain electrode layer provided above the first source/drain electrode layer; a first gate electrode layer provided between the first and second source/drain electrode layers; a first gate insulating film passing through the first gate electrode layer; a hole passing through the second source/drain electrode layer, the first gate insulating film, and the first source/drain electrode layer; and a first channel layer provided on a lateral side of the hole, wherein the first channel layer may include a 2D semiconductor.

40 Claims, 22 Drawing Sheets

(51) Int. Cl.
*H01L 29/786* (2006.01)
*H01L 29/417* (2006.01)
*H01L 27/092* (2006.01)
*H01L 29/78* (2006.01)

(52) U.S. Cl.
CPC .... *H01L 29/41741* (2013.01); *H01L 29/7831* (2013.01); *H01L 29/78642* (2013.01)

(58) Field of Classification Search
CPC ........... H01L 29/78642; H01L 29/0665; H01L 29/7789; H01L 29/78645; H01L 29/7827; H01L 29/1037
See application file for complete search history.

(56) References Cited

U.S. PATENT DOCUMENTS

| | | | | |
|---|---|---|---|---|
| 9,276,134 | B2* | 3/2016 | Karda | H01L 29/7926 |
| 9,385,195 | B1 | 7/2016 | Zhang | |
| 10,079,267 | B1 | 9/2018 | Yeh et al. | |
| 10,290,681 | B2 | 5/2019 | Yeh et al. | |
| 2010/0052055 | A1* | 3/2010 | Takeuchi | H01L 29/78642 |
| | | | | 257/351 |
| 2010/0207172 | A1* | 8/2010 | Masuoka | H01L 29/78642 |
| | | | | 438/212 |
| 2013/0341704 | A1 | 12/2013 | Rachmady et al. | |
| 2015/0200202 | A1* | 7/2015 | Karda | H01L 29/0603 |
| | | | | 438/283 |
| 2015/0200308 | A1* | 7/2015 | Karda | H01L 27/2463 |
| | | | | 257/329 |
| 2016/0005760 | A1* | 1/2016 | Lee | H01L 27/11582 |
| | | | | 257/324 |
| 2016/0005850 | A1* | 1/2016 | Zhao | H01L 29/1033 |
| | | | | 257/329 |
| 2016/0111513 | A1 | 4/2016 | Liu et al. | |
| 2016/0181362 | A1 | 6/2016 | Yang et al. | |
| 2016/0293739 | A1 | 10/2016 | Zhang | |
| 2016/0308042 | A1* | 10/2016 | Zhao | H01L 29/0843 |
| 2018/0076093 | A1* | 3/2018 | Balakrishnan | H01L 29/167 |
| 2018/0182849 | A1 | 6/2018 | Allan et al. | |
| 2019/0067475 | A1* | 2/2019 | Liu | H01L 29/247 |
| 2019/0157261 | A1* | 5/2019 | Balakrishnan | H01L 21/82385 |
| 2020/0243682 | A1* | 7/2020 | Park | H01L 29/0657 |
| 2020/0286793 | A1* | 9/2020 | Zhang | H01L 21/823475 |
| 2020/0328209 | A1* | 10/2020 | Zhang | H01L 21/76895 |
| 2020/0388713 | A1* | 12/2020 | Tsai | H01L 29/42384 |
| 2020/0403096 | A1* | 12/2020 | Jung | H01L 27/092 |
| 2021/0376157 | A1* | 12/2021 | Doornbos | H01L 29/24 |
| 2022/0037527 | A1* | 2/2022 | Jung | H01L 21/3086 |
| 2022/0139786 | A1* | 5/2022 | Gardner | H01L 29/66666 |
| | | | | 438/212 |

OTHER PUBLICATIONS

M. Moore et al. "International Roadmap for Devices and Systems" IEEE Advancing Technology for Humanity, (2017).
Extended European Search Report dated Aug. 11, 2021 issued in corresponding European Patent Application No. 21162665.0-1212.

* cited by examiner

VERTICAL TYPE TRANSISTOR, INVERTER INCLUDING THE SAME, AND VERTICAL TYPE SEMICONDUCTOR DEVICE INCLUDING THE SAME

CROSS-REFERENCE TO RELATED APPLICATION

This application claims the benefit of Korean Patent Application No. 10-2020-0032276, filed on Mar. 16, 2020, and Korean Patent Application No. 10-2020-0175834, filed on Dec. 15, 2020, in the Korean Intellectual Property Office, the disclosure of which is incorporated herein in its entirety by reference.

BACKGROUND

Some example embodiments relate to a vertical type transistor, an inverter, and/or a vertical type semiconductor device.

A vertical type transistor and/or a vertical type semiconductor device may refer to a transistor or a semiconductor device in which a channel is formed in a direction perpendicular to a substrate. Vertical type transistors and/or vertical type semiconductor devices may be more densely integrated in the same area than horizontal transistors or horizontal semiconductor devices.

2D semiconductors have good electrical properties. In general, 2D semiconductors are applied to horizontal transistors or horizontal semiconductor devices.

SUMMARY

Provided are vertical type transistors including a 2D semiconductor.

Alternatively or additionally, provided are inverters including a 2D semiconductor.

Alternatively or additionally, provided are vertical type smear devices including a 2D semiconductor.

However, example embodiments are not limited thereto.

Additional example embodiments will be set forth in part in the description which follows and, in part, will be apparent from the description, or may be learned by practice of example embodiments of the disclosure.

According to some example embodiments, a vertical type transistor includes a substrate, a first source/drain electrode layer on the substrate, a second source/drain electrode layer above the first source/drain electrode layer, a first gate electrode layer between the first and second source/drain electrode layers, a first gate insulating film on a lateral side of the first gate electrode layer, and a first channel layer comprising a 2D semiconductor. The first channel layer is on a lateral side of a hole, the hole passing through the second source/drain electrode layer, the first gate insulating film, and the first source/drain electrode layer.

According to some example embodiments, the first channel layer extends from a lateral surface of the first source/drain electrode layer onto a lateral surface of the second source/drain layer, the lateral surface of the first source/drain layer being exposed through the hole, and the lateral surface of the second source/drain layer being exposed through the hole.

According to some example embodiments, the first source/drain electrode layer and the second source/drain electrode layer are electrically connected to the 2D semiconductor of the first channel layer in an out-of-plane direction.

According to some example embodiments, the first channel layer does not cover a bottom surface of the hole.

According to some example embodiments, the first channel layer covers a bottom surface of the hole.

According to some example embodiments, the first channel layer is between the first source/drain electrode layer and the second source/drain electrode layer.

According to some example embodiments, the first source/drain electrode layer and the second source/drain electrode layer are electrically connected to the 2D semiconductor of the first channel layer in an in-plane direction.

According to some example embodiments, the vertical transistor further comprises a second channel layer on (A) a lateral surface of the first source/drain electrode layer exposed through the hole, (B) a lateral surface of the first channel layer exposed through the hole, and (C) a lateral surface of the second source/drain electrode layer exposed through the hole. The second channel layer comprises a 2D semiconductor.

According to some example embodiments, the first source/drain electrode layer and the second source/drain electrode layer are electrically connected to the 2D semiconductor of the second channel layer in an out-of-plane direction.

According to some example embodiments, the vertical transistor further comprises a lower spacer provided between the first source/drain electrode layer and the first gate electrode layer, and an upper spacer between the second source/drain electrode layer and the first gate electrode layer. The lower spacer electrically isolates the first source/drain electrode layer from the first gate electrode layer, and the upper spacer electrically isolates the second source/drain electrode layer from the first gate electrode layer.

According to some example embodiments, the lower spacer extends between the first source/drain electrode layer and the first gate insulating film, and the upper spacer extends between the second source/drain electrode layer and the first gate insulating film.

According to some example embodiments, the lower spacer, the first gate insulating film, and the upper spacer are a single structure.

According to some example embodiments, the lower spacer and the upper spacer comprise the same insulating material, and the first gate insulating film and the lower spacer comprise different insulating materials.

According to some example embodiments, the vertical type transistor further includes an inner insulating film filling the hole, wherein the first channel layer surrounds the inner insulating film.

According to some example embodiments, the vertical type transistor further includes a passivation film on the second source/drain electrode layer, wherein a void is in the hole between the passivation film and the substrate.

According to some example embodiments, the vertical type transistor further includes an inner insulating film filling the hole the void is defined by (A) a bottom surface of the passivation film exposed by the hole, (B) a lateral surface of the first channel layer exposed by the hole, and (C) a top surface of the substrate exposed by the hole.

According to some example embodiments, the vertical type transistor further comprises an additional gate electrode layer in the hole, and an additional gate insulating film between the additional gate electrode layer and the first channel layer.

According to some example embodiments, the additional gate insulating film is between the additional gate electrode layer and the substrate, and the additional gate electrode layer is separated from the substrate by the additional gate insulating film.

According to some example embodiments, the first channel layer comprises at least one of $MoS_2$, $MoSe_2$, $MoTe_2$, $WSe_2$, $WS_2$, $WTe_2$, $ReS_2$, $SnS_2$, $SnSe_2$, $PdSe_2$, $PtS_2$, $PtSe_2$, $HfS_2$, $HfSe_2$, $HfTe_2$, $TaS_2$, $TaSe_2$, $ZrS_2$, $ZrSe_2$, $ZrTe_2$, $As_2S_3$, $As_2Se_3$, $As_2Te_3$, $Sb_2S_3$, $Sb_2Se_3$, $Bi_2S_3$, $Bi_2Se_3$, $Bi_2Te_3$, GaS, GaSe, GaTe, GeS, GeSe, InSe, InTe, $TiS_3$, $TiBr_3$, $ZrS_3$, $ZrSe_3$, $ZrTe_3$, black phosphorus, or phosphorene.

According to some example embodiments, the first channel layer has a thickness of less than or equal to about 5 nanometers (nm).

According to some example embodiments, an inverter includes a substrate, an n-type transistor on the substrate, and a p-type transistor on the substrate. Each of the n-type transistor and the p-type transistor includes a source electrode layer, a drain electrode layer above the source electrode layer, a gate electrode layer between the source electrode layer and the drain electrode layer, a gate insulating film on a lateral sidewall of the gate electrode layer, and a first channel layer comprising a 2D semiconductor. The first channel layer is on a lateral side of a hole passing through the drain electrode layer, the gate insulating film, and the source electrode layer, the drain electrode layer of the n-type transistor and the drain electrode layer of the p-type transistor are electrically connected to each other, and the source electrode layer of the n-type transistor and the source electrode layer of the p-type transistor are electrically isolated from each other.

According to some example embodiments, the first channel layer of the n-type transistor comprises an n-type 2D semiconductor, and the first channel layer of the p-type transistor comprises a p-type 2D semiconductor.

According to some example embodiments, in at least one of the n-type transistor or the p-type transistor, the first channel layer extends from a lateral surface of the source electrode layer onto a lateral surface of the drain electrode layer, the lateral surface of the source electrode layer being exposed through the hole, the lateral surface of the drain electrode layer being exposed through the hole.

According to some example embodiments, in the at least one of the n-type transistor and the p-type transistor, the source electrode layer and the drain electrode layer are electrically connected to the 2D semiconductor of the first channel layer in an out-of-plane direction.

According to some example embodiments, in at least one of the n-type transistor and the p-type transistor, the first channel layer is between the source electrode layer and the drain electrode layer.

According to some example embodiments, in the at least one of the n-type transistor and the p-type transistor, the source electrode layer and the drain electrode layer are electrically connected to the 2D semiconductor of the first channel layer in an in-plane direction.

According to some example embodiments, at least one of the n-type transistor and the p-type transistor further comprises a second channel layer on (A) a lateral surface of the source electrode layer exposed through the hole, (B) a lateral surface of the first channel layer exposed through the hole, and (C) a lateral surface of the drain electrode layer exposed through the hole, and the second channel layer comprises a 2D semiconductor.

According to some example embodiments, in the at least one of the n-type transistor and the p-type transistor, the source electrode layer and the drain electrode layer are electrically connected to the 2D semiconductor of the second channel layer in an out-of-plane direction.

According to some example embodiments, the inverter further comprises a source insulating film between the source electrode layer of the n-type transistor and the source electrode layer of the p-type transistor. The source electrode layer of the n-type transistor and the source electrode layer of the p-type transistor are electrically isolated from each other by the source insulating film.

According to some example embodiments, the drain electrode layer of the n-type transistor and the drain electrode layer of the p-type transistor are a single structure.

According to some example embodiments, a vertical type semiconductor device comprises a substrate, a lower transistor on the substrate, an upper transistor above the lower transistor, and a first channel layer passing through the lower transistor and the upper transistor. Each of the lower transistor and the upper transistor includes a lower source/drain electrode layer, an upper source/drain electrode layer above the lower source/drain electrode layer, a gate electrode layer provided between the lower source/drain electrode layer and the upper source/drain electrode layer, and a gate insulating film passing through the gate electrode layer. The first channel layer comprises a 2D semiconductor, and the first channel layer passes through the gate insulating film of the lower transistor and the gate insulating film of the upper transistor.

According to some example embodiments, the first channel layer extends from a lateral surface of the lower source/drain electrode layer of the lower transistor onto a lateral surface of the upper source/drain electrode layer of the upper transistor.

According to some example embodiments, in each of the lower transistor and the upper transistor, the lower source/drain electrode layer and the upper source/drain electrode layer are electrically connected to the 2D semiconductor of the first channel layer in an out-of-plane direction.

According to some example embodiments, at least one of the lower transistor and the upper transistor further comprises a second channel layer between the gate insulating film and the first channel layer, and the second channel layer comprises a 2D semiconductor.

According to some example embodiments, the lower source/drain electrode layer and the upper source/drain electrode layer, are electrically connected to the 2D semiconductor of the second channel layer in an in-plane direction, and lower source/drain electrode layer and the upper source/drain electrode layer are immediately adjacent to the second channel layer.

According to some example embodiments, the vertical type semiconductor device further includes an interlayer insulating film between the upper source/drain electrode layer of the lower transistor and the lower source/drain electrode layer of the upper transistor. The upper source/drain electrode layer of the lower transistor and the lower source/drain electrode layer of the upper transistor are electrically isolated from each other by the interlayer insulating film.

According to some example embodiments, the upper source/drain electrode layer of the lower transistor and the lower source/drain electrode layer of the upper transistor are a single electrode layer.

According to some example embodiments, a vertical type transistor includes a drain electrode on a substrate, a gate electrode on the drain electrode, a gate insulating film on a lateral side of the first gate electrode, and a first channel layer comprising a 2D semiconductor, wherein the first channel layer is on a lateral side of a hole passing through the first gate insulating film and the drain electrode.

According to some example embodiments, when viewed in a plan-view, the hole has a non-circular shape.

According to some example embodiments, when viewed in a cross-sectional view, the hole has a tapered profile.

According to some example embodiments, the hole has a non-cylindrical shape.

BRIEF DESCRIPTION OF THE DRAWINGS

The above and other aspects, features, and advantages of some example embodiments of inventive concepts will be more apparent from the following description taken in conjunction with the accompanying drawings, in which.

DETAILED DESCRIPTION OF SOME EXAMPLE EMBODIMENTS

Figure 1:
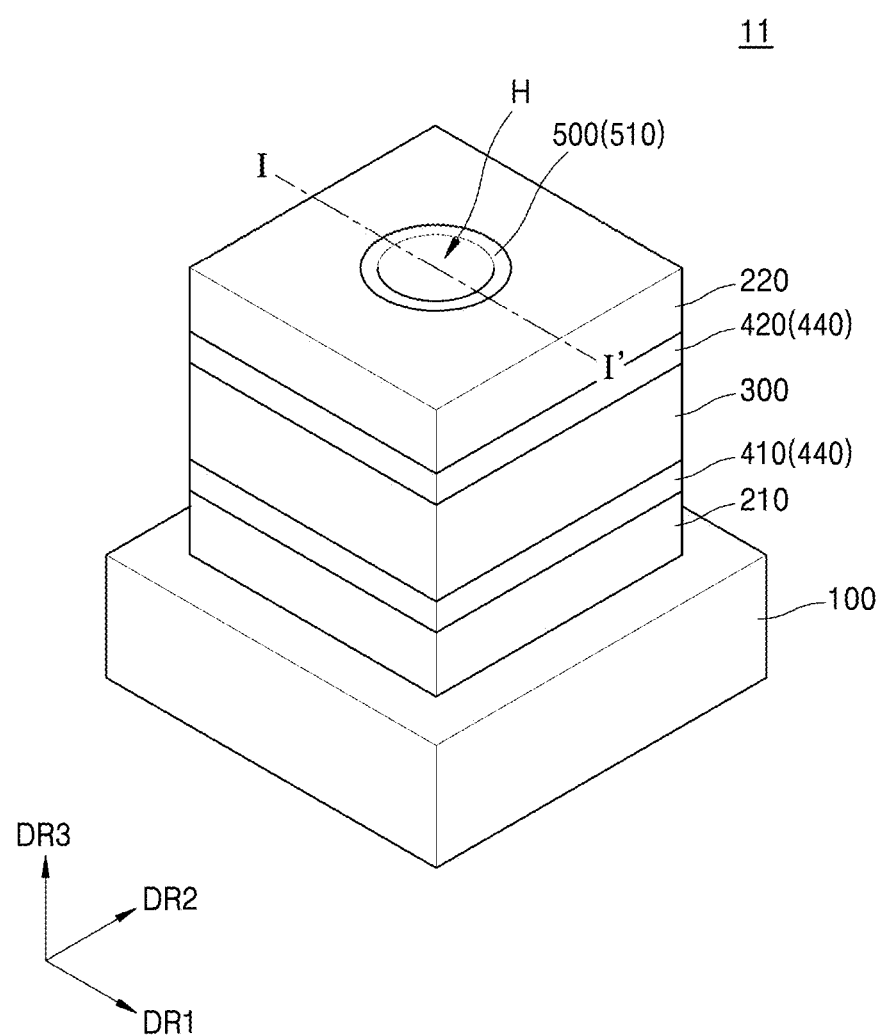
FIG. 1 is a perspective view illustrating a vertical type transistor according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described with reference to the accompanying drawings. In the drawings, like reference numerals refer to like elements, and the sizes of elements may be exaggerated for clarity of illustration. Example embodiments described herein are for illustrative purposes only, and various modifications may be made therein.

In the following description, when an element is referred to as being "above" or "on" another element, it may be directly on the other element while making contact with the other element or may be above the other element without making contact with the other element.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as "unit" or "~or/er" are used to denote a unit having at least one function or operation and implemented with hardware, software, or a combination of hardware and software.

Figure 2:
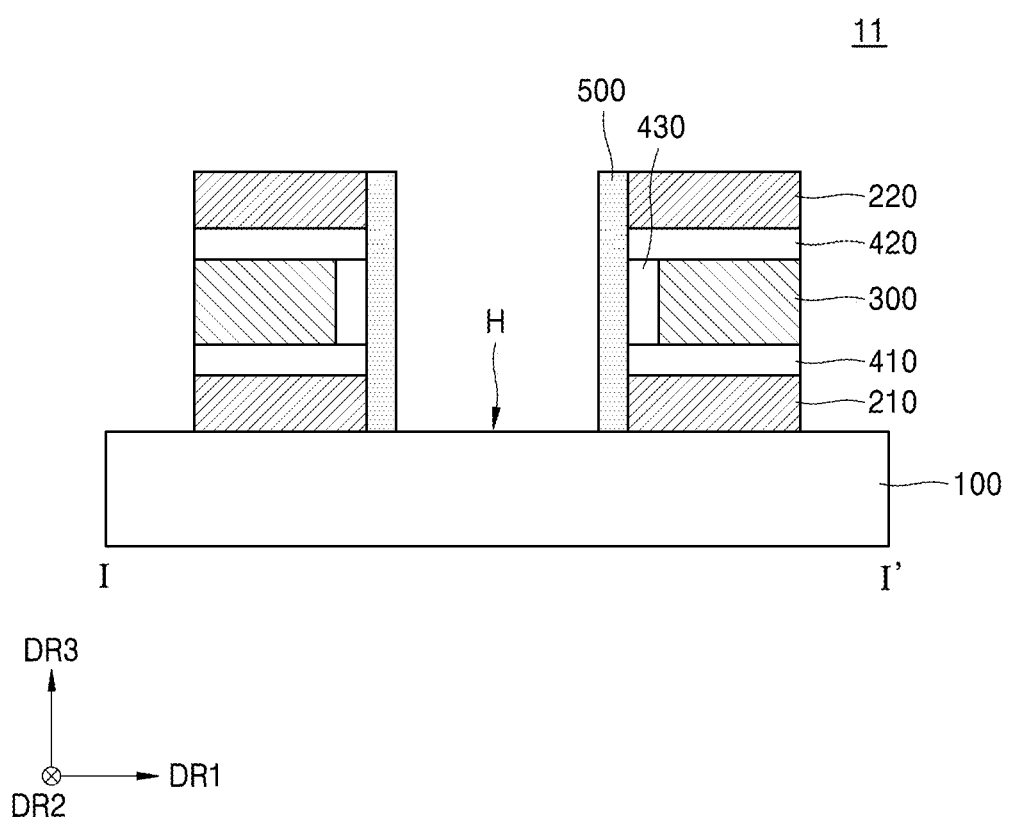
FIG. 2 is a cross-sectional view taken along line I-I' of FIG. 1.

FIG. 1 is a perspective view illustrating a vertical type transistor 11 according to some example embodiments. FIG. 2 is a cross-sectional view taken along line I-I' of FIG. 1.

Referring to FIGS. 1 and 2, the vertical type transistor 11 may be provided as follows. The vertical type transistor 11 may include a substrate 100, a first source/drain electrode layer 210, a second source/drain electrode layer 220, a gate electrode layer 300, a gate insulating film 430, a first spacer layer 410, a second spacer layer 420, and a channel layer 500. The substrate 100 may include an insulating material. For example, the substrate 100 may include an intrinsic semiconductor substrate such as a silicon substrate or a silicon-germanium substrate or a compound semiconductor substrate such as a III-V and/or II-VI substrate, a glass substrate, a sapphire substrate, or a substrate including an insulator such as silicon oxide.

The first source/drain electrode layer 210 may be provided on the substrate 100. The first source/drain electrode layer 210 may extend in a first direction DR1 and a second direction DR2, which are parallel to a top surface of the substrate 100. In some example embodiments, the first source/drain electrode layer 210 may be or correspond to a source electrode of the vertical type transistor 11. The first source/drain electrode layer 210 may include an electrically conductive material. For example, the first source/drain electrode layer 210 may include a semiconductor material such as silicon, a metal such as gold (Au), silver (Ag), or copper (Cu), or an alloy of various metals; however, example embodiments are not limited thereto. Additionally or alternatively, the first source/drain electrode layer 210 may be doped with impurities, such as at least one of boron (B), phosphorus (P), or arsenic (As).

The second source/drain electrode layer 220 may be provided above the first source/drain electrode layer 210. The second source/drain electrode layer 220 may extend in the first direction DR1 and the second direction DR2. The second source/drain electrode layer 220 may be spaced apart from the first source/drain electrode layer 210. For example, the second source/drain electrode layer 220 may be apart from the first source/drain electrode layer 210 in a third direction DR3 perpendicular to the top surface of the substrate 100. When the first source/drain electrode layer 210 is or corresponds to a source electrode of the vertical type transistor 11, the second source/drain electrode layer 220 may be or correspond to a drain electrode of the vertical type transistor 11. The second source/drain electrode layer 220 may include an electrically conductive material that is the same as, or different from, the material of the first source/drain electrode. For example, the second source/drain electrode layer 220 may include a semiconductor material such as silicon, a metal such as gold (Au), silver (Ag), or copper (Cu), or an alloy of various metals; however, example embodiments are not limited thereto. Additionally or alternatively, the second source/drain electrode layer 220 may be doped with impurities, such as at least one of boron (B), phosphorus (P), or arsenic (As). A conductivity type of the second source/drain electrode layer 220 may be the same as a conductivity type of the first source/drain electrode layer 210; however, example embodiments are not limited thereto.

The gate electrode layer 300 may be provided between the first and second source/drain electrode layers 210 and 220. The gate electrode layer 300 may extend in the first direction DR1 and the second direction DR2. The gate electrode layer 300 may be apart from the first and second source/drain electrode layers 210 and 220. For example, the gate electrode layer 300 may be apart from the first and second source/drain electrode layers 210 and 220 in the third direction DR3. In some example embodiments, the gate electrode layer 300 may be a gate electrode of the vertical type transistor 11. The gate electrode layer 300 may include an electrically conductive material. For example, the gate electrode layer 300 may include the same material as, or different material from, either or both of the first and second source/drain electrode layers 210 and 220. For example, the gate electrode layer 300 may include a semiconductor material such as silicon, a metal such as gold (Au), silver (Ag), or copper (Cu), or may include an alloy of various metals; however, example embodiments are not limited thereto. Additionally or alternatively, the first gate electrode layer 300 may be doped with impurities, such as at least one of boron (B), phosphorus (P), or arsenic (As).

The first spacer layer 410 may be provided between the gate electrode layer 300 and the first source/drain electrode layer 210. The first spacer layer 410 may electrically isolate, e.g. may electrically cut the gate electrode layer 300 off from the first source/drain electrode layer 210. The first spacer layer 410 may include an insulating material. For example, the first spacer layer 410 may include at least one of a silicon oxide (for example, $SiO_2$), a silicon nitride (for example, SiN), or a silicon oxynitride (for example, SiON).

The second spacer layer 420 may be provided between the gate electrode layer 300 and the second source/drain electrode layer 220. The second spacer layer 420 may electrically isolate, e.g. electrically cut the gate electrode layer 300 off from the second source/drain electrode layer 220. The second spacer layer 420 may include an insulating material that is the same as, or different from, the first spacer layer 420. For example, the second spacer layer 420 may include at least one of silicon oxide (for example, $SiO_2$), a silicon nitride (SiN), or a silicon oxynitride (SiON).

The gate insulating film 430 may be surrounded by the gate electrode layer 300. The gate insulating film 430 may be provided between the first and second spacer layers 410 and 420. The gate insulating film 430 may extend in the third direction DR3 and may be in direct contact with the first and second spacer layers 410 and 420. The gate insulating film 430 may include a dielectric material. For example, the gate insulating film 430 may include a high-k dielectric material.

A hole H may be provided on the substrate 100. The hole H may pass through the first and second source/drain electrode layers 210 and 220, the first and second spacer layers 410 and 420, and the gate insulating film 430. The hole H may be defined by lateral surfaces of the first and second source/drain electrode layers 210 and 220, the first and second spacer layers 410 and 420, and the gate insulating film 430. In some example embodiments, the lateral surfaces of the first and second source/drain electrode layers 210 and 220, the first and second spacer layers 410 and 420, and the gate insulating film 430, which are exposed through the hole H, may form a common surface. For example, the lateral surfaces of the first and second source/drain electrode layers 210 and 220, the first and second spacer layers 410 and 420, and the gate insulating film 430, which are exposed through the hole H, may extend in the third direction DR3, e.g. may extend perpendicular to a surface of the substrate 100. The hole H may expose the top surface of the substrate 100.

The channel layer 500 may be provided on a lateral side of the hole H. The lateral side of the hole H may refer to the lateral surfaces of the first and second source/drain electrode layers 210 and 220, the first and second spacer layers 410 and 420, and the gate insulating film 430, which are exposed through the hole H. The channel layer 500 may cover the lateral surfaces of the first and second source/drain electrode layers 210 and 220, the first and second spacer layers 410 and 420, and the gate insulating film 430, which are exposed through the hole H. The channel layer 500 may extend along the lateral surfaces of the first and second source/drain electrode layers 210 and 220, the first and second spacer layers 410 and 420, and the gate insulating film 430, which are exposed through the hole H. For example, the channel layer 500 may extend in the third direction DR3. The channel layer 500 may be adjacent to, e.g. connected to or directly connected to, lateral surfaces of any or each of the first and second source/drain electrode layers 210 and 220, the first and second spacer layers 410 and 420, and the gate insulating film 430. The channel layer 500 may not cover or may only partially cover a bottom surface of the hole H. The channel layer 500 may expose the top surface of the substrate 100.

The channel layer 500 may include a 2D semiconductor. For example, the channel layer 500 may consist of or include at least one of $MoS_2$, $MoSe_2$, $MoTe_2$, $WSe_2$, $WS_2$, $WTe_2$, $ReS_2$, $SnS_2$, $SnSe_2$, $PdSe_2$, $PtS_2$, $PtSe_2$, $HfS_2$, $HfSe_2$, $HfTe_2$, $TaS_2$, $TaSe_2$, $ZrS_2$, $ZrSe_2$, $ZrTe_2$, $As_2S_3$, $As_2Se_3$, $As_2Te_3$, $Sb_2S_3$, $Sb_2Se_3$, $Bi_2S_3$, $Bi_2Se_3$, $Bi_2Te_3$, GaS, GaSe, GaTe, GeS, GeSe, InSe, InTe, $TiS_3$, $TiBr_3$, $ZrS_3$, $ZrSe_3$, $ZrTe_3$, black phosphorus, phosphorene. However, the 2D semiconductor included in the channel layer 500 is not limited to the above listed materials. The 2D semiconductor included in the channel layer 500 may extend along the lateral surfaces of the first and second source/drain electrode layers 210 and 220, the first and second spacer layers 410 and 420, and the gate insulating film 430, which are exposed through the hole H. For example, the 2D semiconductor included in the channel layer 500 may extend in the third direction DR3. When the 2D semiconductor includes a plurality of layers, the stacking direction of the plurality of layers is defined as an out-of-plane direction, and a direction parallel with one layer of the 2D semiconductor is defined as an in-plane direction. In an example, the 2D semiconductor included in the channel layer 500 may have a monolayer structure. In some example embodiments, the 2D semiconductor included in the channel layer 500 may have a multilayer structure. For example, the 2D semiconductor included in the channel layer 500 may have a two-, three-, four-, or five-layer structure. The thickness of the channel layer 500 may be determined variably, e.g. as needed. For example, the thickness of the channel layer 500 may be about 5 nanometers (nm) or less, and may correspond to between one monolayer to about five monolayers. The thickness of the channel layer 500 may refer to the size of the channel layer 500 in the first direction DR1. The channel layer 500 may be electrically connected to the first and second source/drain electrode layers 210 and 220. The channel layer 500 may be in contact with, e.g. in direct contact with the first and second source/drain electrode layers 210 and 220. A lateral surface of the channel layer 500 may be in contact with, e.g. in direct contact with the first and second source/drain electrode layers 210 and 220, for example, the channel layer 500 may be in direct contact with the first and second source/drain electrode layers 210 and 220 in the out-of-plane direction. The channel layer 500 may include, e.g. may be doped with, impurities. The impurities may be doped uniformly within the channel layer 500, or alternatively, portions of the channel layer 500 may be more heavily doped than other portions of the channel layer 500. However, example embodiments are not limited thereto, and the channel layer 500 may not include impurities.

The channel layer 500 may be electrically isolated, e.g. electrically cut off from the gate electrode layer 300. The channel layer 500 may be separated from the gate electrode layer 300 by the gate insulating film 430. The channel layer 500 may be a layer in which a channel of the vertical type transistor 11 is formed. A channel, e.g. a conductive path from a source to a drain, may be formed or may disappear in the channel layer 500 according to a voltage applied to the gate electrode layer 300. When a channel is formed in the channel layer 500, current may flow between the first and second source/drain electrode layers 210 and 220 through the channel layer 500.

Some example embodiments may provide the vertical type transistor 11 which has the channel layer 500 extending in the third direction DR3 perpendicular to the top surface of the substrate 100.

Figure 3:
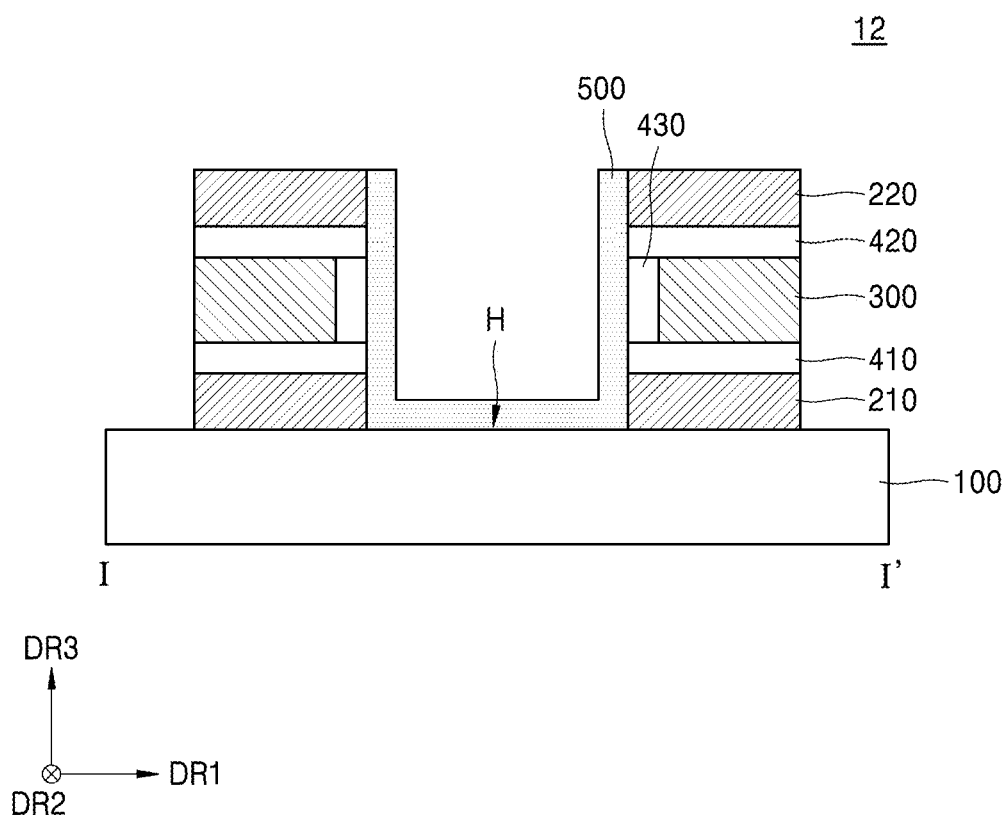
FIG. 3 is a cross-sectional view illustrating a vertical type transistor according to some example embodiments, the cross-sectional view corresponding to line I-I' of FIG. 1.

FIG. 3 is a cross-sectional view illustrating a vertical type transistor 12 according to some example embodiments, the cross-sectional view corresponding to line I-I' of FIG. 1. For clarity of illustration, substantially the same structures as those described with reference to FIGS. 1 and 2 may not be described here.

Referring to FIG. 3, the vertical type transistor 12 may be provided as follows. The vertical type transistor 12 may include a substrate 100, a first source/drain electrode layer 210, a second source/drain electrode layer 220, a gate electrode layer 300, a gate insulating film 430, a first spacer layer 410, a second spacer layer 420, and a channel layer 500. The substrate 100, the first source/drain electrode layer 210, the second source/drain electrode layer 220, the gate electrode layer 300, the gate insulating film 430, the first spacer layer 410, and the second spacer layer 420 may be substantially the same as those described with reference to FIGS. 1 and 2.

Unlike in example embodiments described with reference to FIGS. 1 and 2, the channel layer 500 may be provided on a bottom surface of a hole H. The bottom surface of the hole H may be a top surface of the substrate 100. The channel layer 500 may cover, e.g. conformally cover, the top surface of the substrate 100, which is exposed through the hole H. The channel layer 500 may extend along the top surface of the substrate 100, which is exposed through the hole H. Although it is illustrated that the channel layer 500 completely covers the top surface of the substrate 100, which is exposed through the hole H, this is an example. In some example embodiments, the channel layer 500 may partially cover the top surface of the substrate 100, which is exposed through the hole H.

Some example embodiments may provide the vertical type transistor 12, which has the channel layer 500 extending in a third direction DR3 perpendicular to the top surface of the substrate 100.

Figure 4:
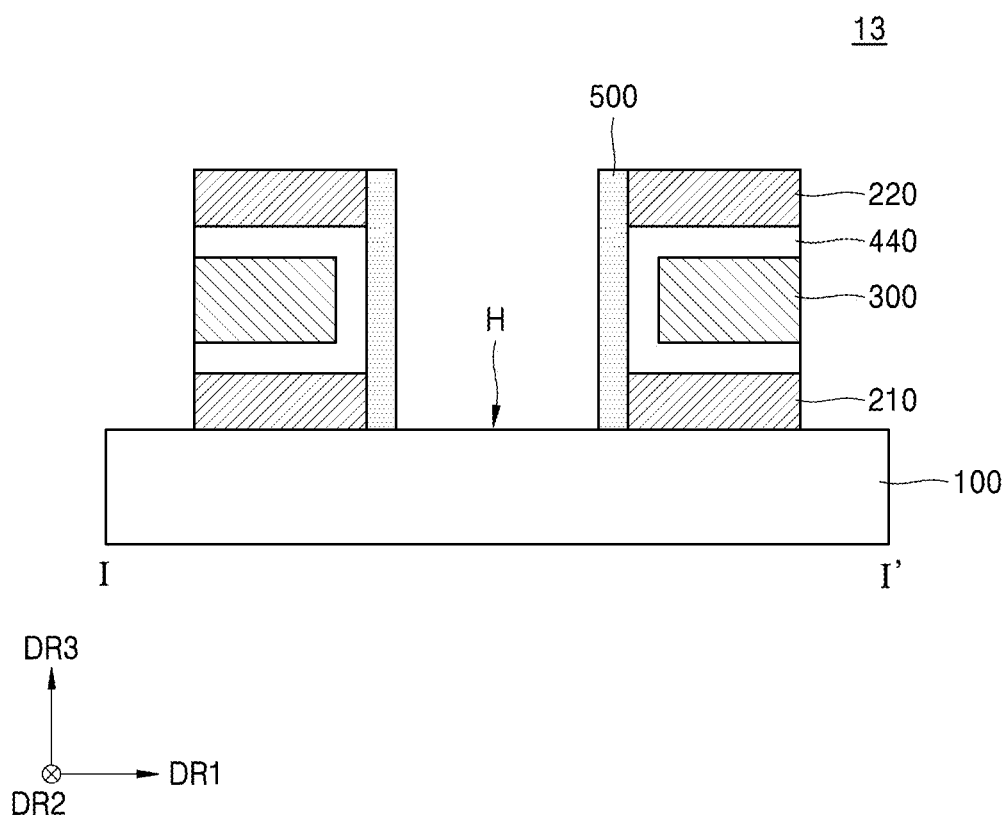
FIG. 4 is a cross-sectional view illustrating a vertical type transistor according to some example embodiments, the cross-sectional view corresponding to line I-I' of FIG. 1.

FIG. 4 is a cross-sectional view illustrating a vertical type transistor 13 according to some example embodiments, the cross-sectional view corresponding to line I-I' of FIG. 1. For clarity of illustration, substantially the same structures as those described with reference to FIGS. 1 and 2 may not be described here.

Referring to FIG. 4, the vertical type transistor 13 may be provided as follows. The vertical type transistor 13 may include a substrate 100, a first source/drain electrode layer 210, a second source/drain electrode layer 220, a gate electrode layer 300, a third spacer layer 440, and a channel layer 500. The substrate 100, the first source/drain electrode layer 210, the second source/drain electrode layer 220, and the channel layer 500 may be substantially the same as those described with reference to FIGS. 1 and 2.

Unlike in example embodiments described with reference to FIGS. 1 and 2, the third spacer layer 440 may be provided. The third spacer layer 440 may extend along a surface of the gate electrode layer 300. The third spacer layer 440 may be provided between the gate electrode layer 300 and the first source/drain electrode layer 210, between the gate electrode layer 300 and the second source/drain electrode layer 220, and between the gate electrode layer 300 and the channel layer 500. The first source/drain electrode layer 210, the second source/drain electrode layer 220, and the channel layer 500 may be spaced apart from the gate electrode layer 300 by the third spacer layer 440. The third spacer layer 440 may include an electric insulating material. For example, the third spacer layer 440 may include at least one of silicon oxide (e.g., $SiO_2$), silicon nitride (e.g., SiN), or silicon oxynitride (e.g., SiON). The third spacer layer 440 may electrically insulate the first source/drain electrode layer 210, the second source/drain electrode layer, and the channel layer 500 from the gate electrode layer 300.

Some example embodiments may provide the vertical type transistor 13, which has the channel layer 500 extending in a third direction DR3 perpendicular to the top surface of the substrate 100.

Figure 5:
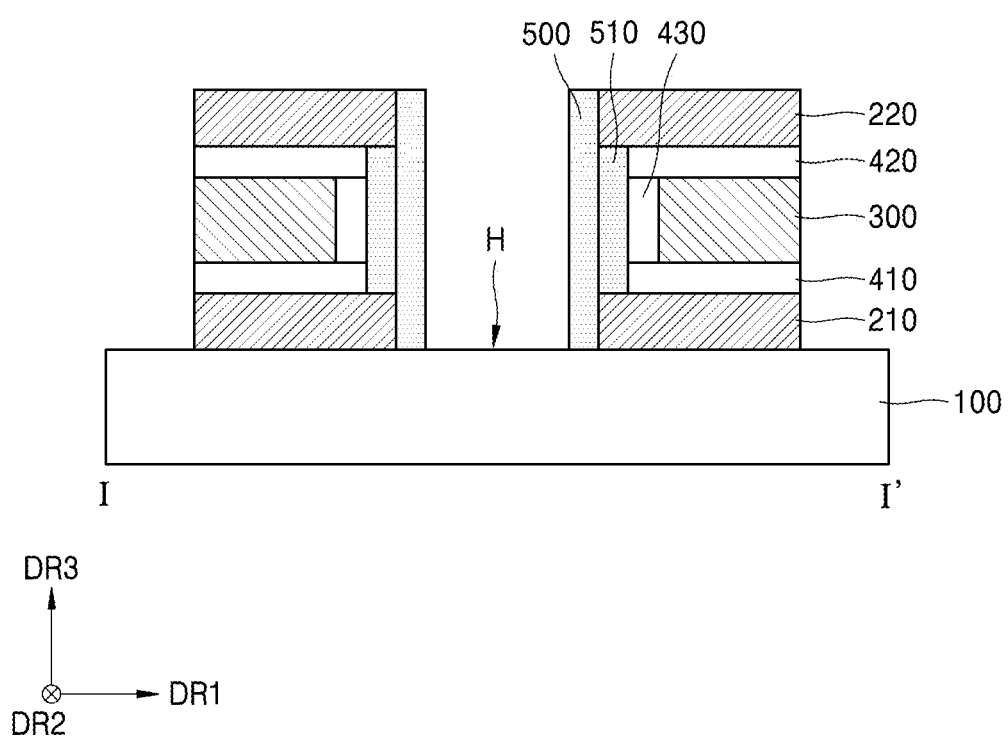
FIG. 5 is a cross-sectional view illustrating a vertical type transistor according to some example embodiments, the cross-sectional view corresponding to line I-I' of FIG. 1.

FIG. 5 is a cross-sectional view illustrating a vertical type transistor 14 according to some example embodiments, the cross-sectional view corresponding to line I-I' of FIG. 1. For clarity of illustration, substantially the same structures as those described with reference to FIGS. 1 and 2 may not be described here.

Referring to FIG. 5, the vertical type transistor 14 may be provided as follows. The vertical type transistor 14 may include a substrate 100, a first source/drain electrode layer 210, a second source/drain electrode layer 220, a gate electrode layer 300, a gate insulating film 430, a first spacer layer 410, a second spacer layer 420, a channel layer 500, and an additional channel layer 510. The substrate 100, the first source/drain electrode layer 210, the second source/drain electrode layer 220, the gate electrode layer 300, the gate insulating film 430, the first spacer layer 410, and the second spacer layer 420 may be substantially the same as those described with reference to FIGS. 1 and 2.

Unlike in example embodiments described with reference to FIGS. 1 and 2, the additional channel layer 510 may be provided between the channel layer 500 and the gate insulating film 430. The additional channel layer 510 may include a 2D semiconductor. The additional channel layer 510 may be provided between the first and second source/drain electrode layers 210 and 220. The additional channel layer 510 may cover lateral surfaces of the first and second spacer layers 410 and 420 and the gate insulating film 430, which are exposed through a hole H. The additional channel layer 510 and the 2D semiconductor included in the additional channel layer 510 may extend along the lateral surfaces of the first and second spacer layers 410 and 420 and the gate insulating film 430, which are exposed through the hole H. For example, the additional channel layer 510 and the 2D semiconductor included in the additional channel layer 510 may extend in a third direction DR3. In some example embodiments, the 2D semiconductor included in the additional channel layer 510 may have a monolayer structure. In some example embodiments, the 2D semiconductor included in the additional channel layer 510 may have a multilayer structure. For example, the 2D semiconductor included in the additional channel layer 510 may have a two-, three-, four-, or five-layer structure. The thickness of the additional channel layer 510 may be determined as needed. For example, the thickness of the additional channel layer 510 may be about 5 nanometers (nm) or less. The thickness of the additional channel layer 510 may be the same as, or different from, the thickness of the first channel layer 500. Furthermore, the additional channel layer may include or consist of the same material as, or different material from, that of the first channel layer 500.

The additional channel layer 510 may be electrically connected to the first source/drain electrode layer 210 and the second source/drain electrode layer 220 in an in-plane direction. For example, a bottom surface of the additional channel layer 510 may be in direct contact with a top surface of the first source/drain electrode layer 210. For example, a top surface of the additional channel layer 510 may be in direct contact with a bottom surface of the second source/drain electrode layer 220.

The additional channel layer 510 may be electrically connected to the channel layer 500 in an out-of-plane direction. For example, mutually-facing lateral surfaces of the additional channel layer 510 and the channel layer 500 may be in direct contact with each other. The mutually-facing lateral surfaces of the additional channel layer 510 and the channel layer 500 may extend in the third direction DR3.

The additional channel layer 510 may be electrically isolated, e.g. electrically cut off from the gate electrode layer 300. The additional channel layer 510 may be separated from the gate electrode layer 300 by the gate insulating film 430. The additional channel layer 510 may be or correspond to a layer in which a channel of the vertical type transistor 14 is formed. A channel may be formed or may disappear to electrically connect or disconnect the first and second source/drain electrode layers 210 and 220 in the additional channel layer 510 according to a voltage applied to the gate electrode layer 300. When a channel is formed in the additional channel layer 510, current may flow between the first and second source/drain electrode layers 210 and 220 through the additional channel layer 510. In some example embodiments, when a channel is formed in the channel layer 500, a channel may be formed in the additional channel layer 510. Current may flow between the first and second source/drain electrode layers 210 and 220 along the channel in the channel layer 500 and the channel in the additional channel layer 510.

Some example embodiments may provide the vertical type transistor 14 that includes the additional channel layer 510 electrically connected to the first and second source/drain electrode layers 210 and 220 in the in-plane direction, and the channel layer 500 electrically connected to the first and second source/drain layers 210 and 220 in the out-of-plane direction.

Figure 6:
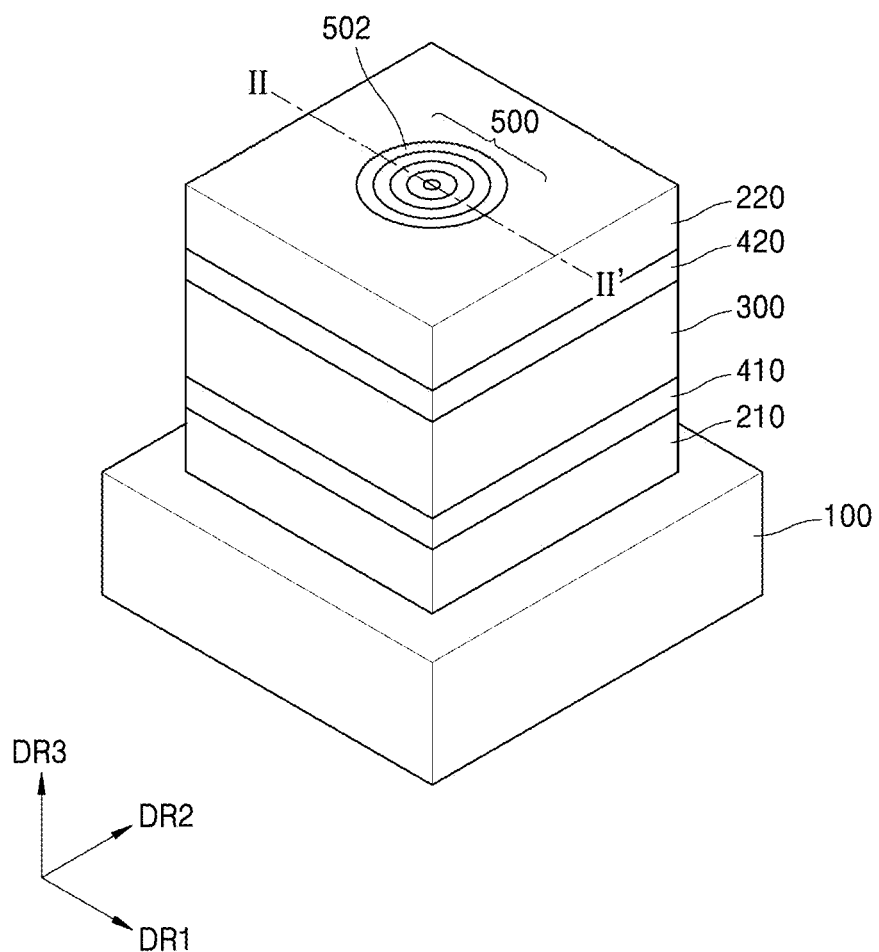
FIG. 6 is a perspective view illustrating a vertical type transistor according to some example embodiments.
Figure 7:
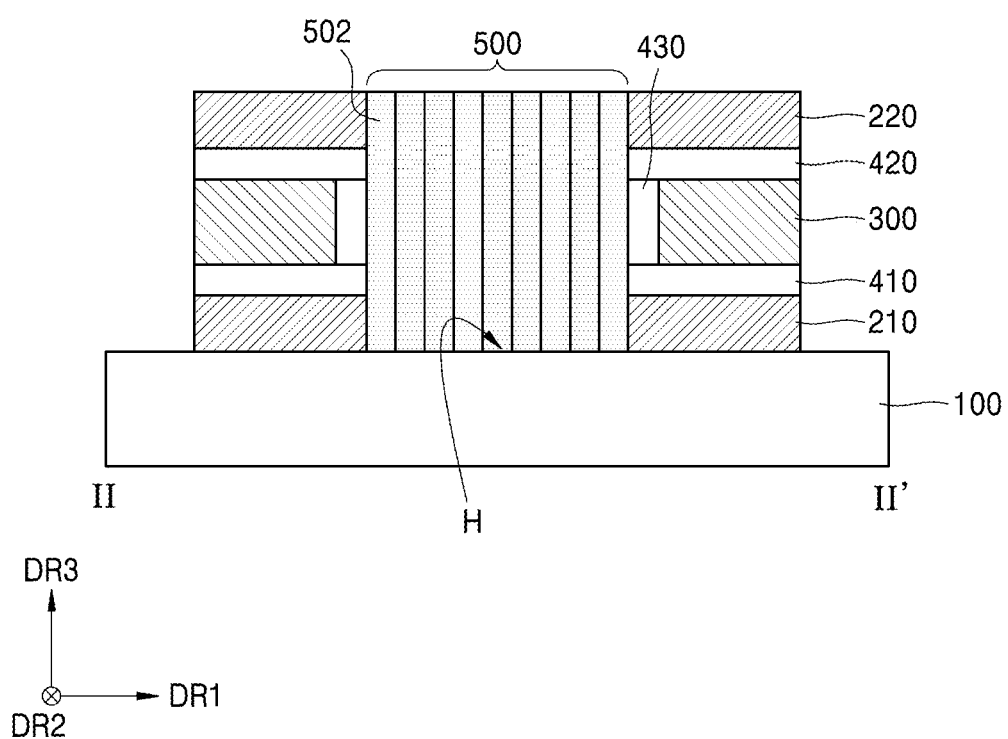
FIG. 7 is a cross-sectional view of the vertical type transistor, which is taken along line II-II' of FIG. 6.

FIG. 6 is a perspective view illustrating a vertical type transistor 15 according to some example embodiments. FIG. 7 is a cross-sectional view of the vertical type transistor 15, which is taken along line II-II' of FIG. 6. For clarity of illustration, substantially the same structures as those described with reference to FIGS. 1 and 2 may not be described here.

Referring to FIGS. 6 and 7, the vertical type transistor 15 may be provided as follows. The vertical type transistor 15 may include a substrate 100, a first source/drain electrode layer 210, a second source/drain electrode layer 220, a gate electrode layer 300, a gate insulating film 430, and a first spacer layer 410, a second spacer layer 420, and a channel layer 500. The substrate 100, the first source/drain electrode layer 210, the second source/drain electrode layer 220, the gate electrode layer 300, the gate insulating film 430, the first spacer layer 410, and the second spacer layer 420 may be substantially the same as those described with reference to FIGS. 1 and 2.

Unlike in example embodiments described with reference to FIGS. 1 and 2, the channel layer 500 may include a plurality of sub-channel layers 502. The sub-channel layers 502 may include a 2D semiconductor. The sub-channel layers 502 may be arranged in a direction from a center axis of a hole H toward a lateral side of the hole H. The center axis of the hole H may be an imaginary axis (not shown) passing through the center of the hole H and extending in a third direction DR3. A relatively outer sub-channel layer 502 may surround a relatively inner sub-channel layer 502.

The sub-channel layers 502 may extend along the hole H. For example, the sub-channel layers 502 may extend in the third direction DR3. For example, the sub-channel layers 502 share the center axis and may have an open-tube shape with different planar sizes. Each of the sub-channel layers 502 may include or consist of the same material, or may include or consist of different materials. Furthermore a thickness of each of the sub-channel layers 502 may be the same, or may be different from, one another. The term "planar size" refers to a size in a view in the third direction DR3. The innermost sub-channel layer 502 may have an open-tube shape or a solid pillar shape. The sub-channel layers 502 may fill the hole H. A relatively inner sub-channel layer 502 may have a smaller planar size than a relatively outer sub-channel layer 502. The sub-channel layers 502 may extend in the third direction DR3. Sub-channel layers 502 immediately adjacent to each other may be in direct contact with each other in the out-of-plane direction. The sub-channel layers 502 may be in contact with, e.g. in direct contact with, a top surface of the substrate 100. The sub-channel layers 502 may expose the top surface of the substrate 100.

Some example embodiments may provide the vertical type transistor 15, which has the sub-channel layers 502 extending in the third direction DR3 perpendicular to the top surface of the substrate 100.

Figure 8:
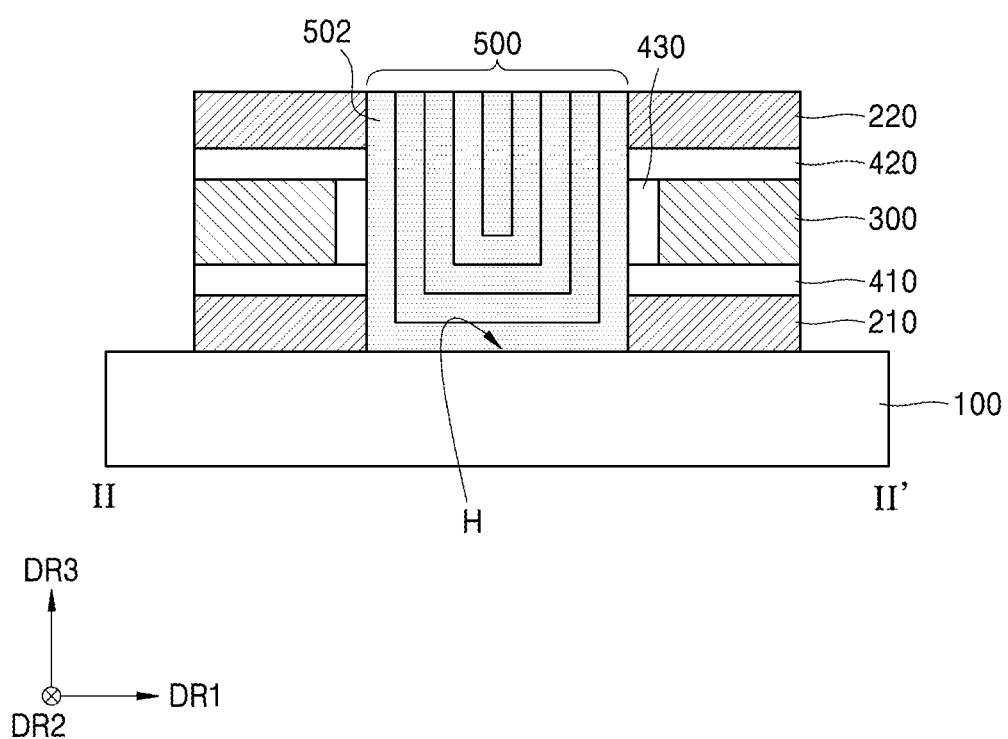
FIG. 8 is a cross-sectional view illustrating a vertical type transistor, the cross-sectional view corresponding to line II-II' of FIG. 6.

FIG. 8 is a cross-sectional view illustrating a vertical type transistor 16, the cross-sectional view corresponding to line II-II' of FIG. 6. For clarity of illustration, substantially the same structures as those described with reference to FIGS. 1 and 2 may not be described here.

Referring to FIG. 8, the vertical type transistor 16 may be provided as follows. The vertical type transistor 16 may include a substrate 100, a first source/drain electrode layer 210, a second source/drain electrode layer 220, a gate electrode layer 300, a gate insulating film 430, and a first spacer layer 410, a second spacer layer 420, and a channel layer 500. The substrate 100, the first source/drain electrode layer 210, the second source/drain electrode layer 220, the gate electrode layer 300, the gate insulating film 430, the first spacer layer 410, and the second spacer layer 420 may be substantially the same as those described with reference to FIGS. 1 and 2.

The channel layer 500 may include a plurality of sub-channel layers 502. Unlike in example embodiments shown in FIG. 7, the sub-channel layers 502 may have a half-open tube shape. The sub-channel layers 502 may respectively include lower horizontal portions, which are parallel to a top surface of the substrate 100. The horizontal portions may be stacked on the substrate 100. The horizontal portion of the outermost sub-channel layer 502 may extend along the top surface of the substrate 100. The horizontal portion of the outermost sub-channel layer 502 may cover the top surface of the substrate 100.

Some example embodiments may provide the vertical type transistor 16, which has the sub-channel layers 502 extending in a third direction DR3 perpendicular to the top surface of the substrate 100.

Figure 9:
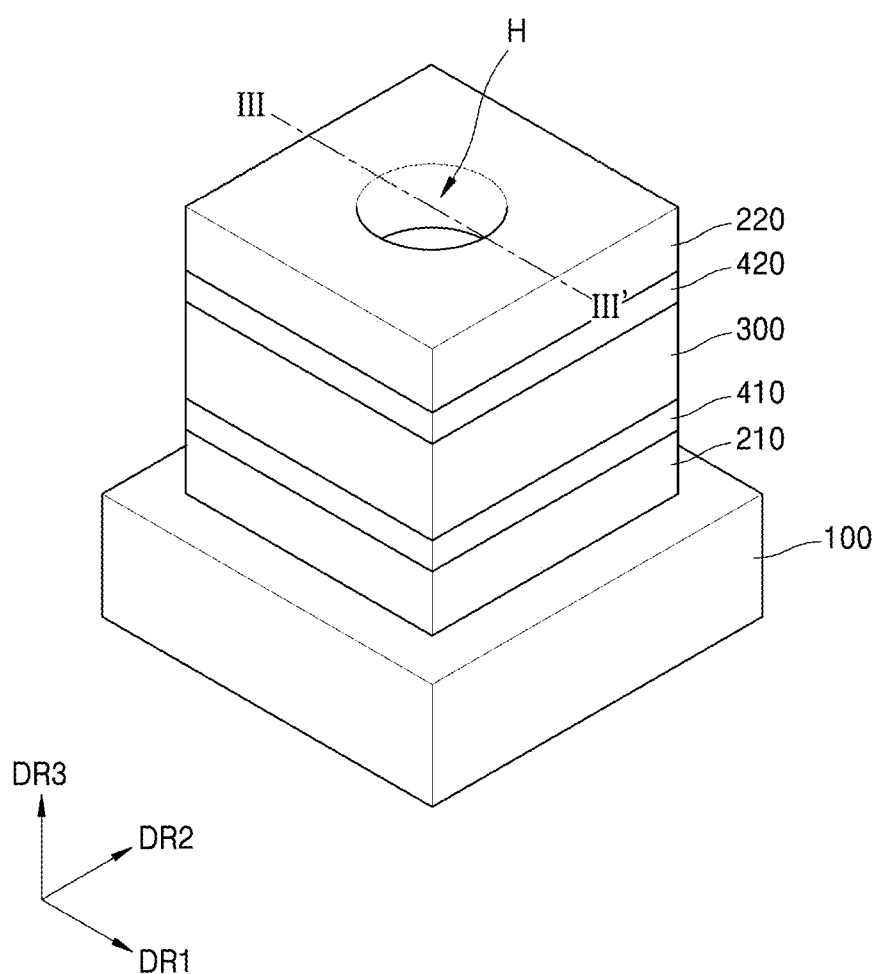
FIG. 9 is a perspective view illustrating a vertical type transistor according to some example embodiments.
Figure 10:
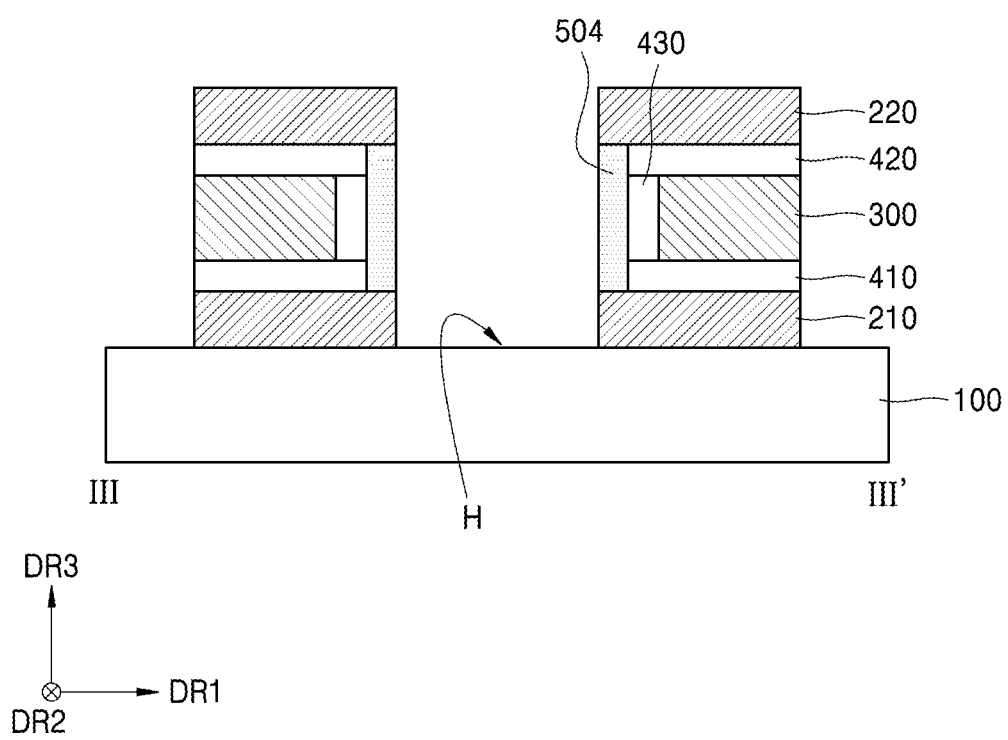
FIG. 10 is a cross-sectional view of the vertical type transistor, which is taken along line III-III' of FIG. 9.

FIG. 9 is a perspective view illustrating a vertical type transistor 17 according to some example embodiments. FIG. 10 is a cross-sectional view of the vertical type transistor 17, which is taken along line III-III' of FIG. 9. For clarity of illustration, substantially the same structures as those described with reference to FIGS. 1 and 2 may not be described here.

Referring to FIGS. 9 and 10, the vertical type transistor 17 may be provided as follows. The vertical type transistor 17 may include a substrate 100, a first source/drain electrode layer 210, a second source/drain electrode layer 220, a gate electrode layer 300, a gate insulating film 430, a first spacer layer 410, a second spacer layer 420, and a channel layer 500. The substrate 100, the first source/drain electrode layer 210, the second source/drain electrode layer 220, the gate electrode layer 300, the gate insulating film 430, the first spacer layer 410, and the second spacer layer 420 may be substantially the same as those described with reference to FIGS. 1 and 2.

Unlike in example embodiments described with reference to FIGS. 1 and 2, the channel layer 500 may be provided between the first and second source/drain electrode layers 210 and 220. The channel layer 500 may be provided on lateral surfaces of the first and second spacer layers 410 and 420 and the gate insulating film 430, which are exposed through a hole H.

The channel layer 500 may be electrically connected to the first source/drain electrode layer 210 and the second source/drain electrode layer 220 in an in-plane direction. The first source/drain electrode layer 210 and the second source/drain electrode layer 220 may be in edge contact with the channel layer 500. The term "edge contact" may refer to contact with an end portion of a 2D semiconductor in an in-plane direction. For example, the in-plane direction of the channel layer 500 may be a third direction DR3. For example, a lower end portion of the channel layer 500 may be in direct contact with a top surface of the first source/drain electrode layer 210. For example, an upper end portion of the channel layer 500 may be in direct contact with a bottom surface of the second source/drain electrode layer 220.

The channel layer 500 may be electrically isolate, e.g. may electrically cut off from the gate electrode layer 300. The channel layer 500 may be separated from the gate electrode layer 300 by the gate insulating film 430.

Some example embodiments may provide the vertical type transistor 17 which includes the channel layer 500 provided between the first and second source/drain electrode layers 210 and 220, and the first and second source/drain electrode layers 210 and 220 may be in contact with the channel layer 500 in the in-plane direction.

Figure 11:
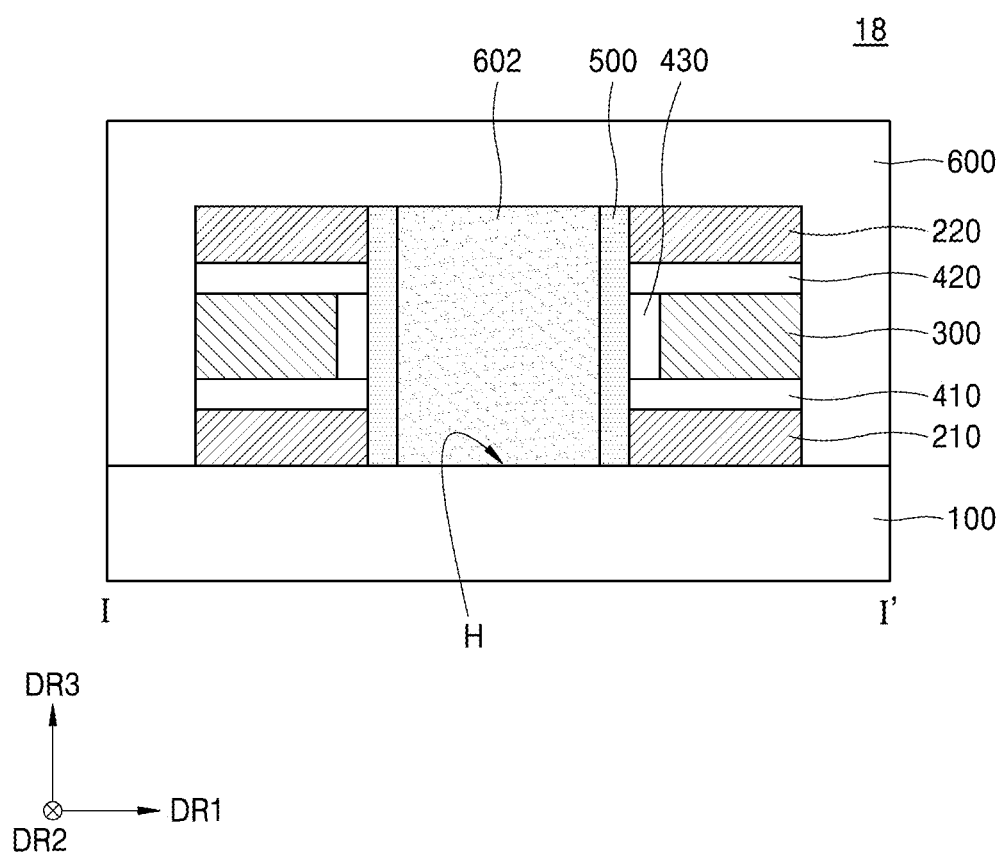
FIG. 11 is a cross-sectional view illustrating a vertical type transistor according to some example embodiments, the cross-sectional view corresponding to line I-I' of FIG. 1.

FIG. 11 is a cross-sectional view illustrating a vertical type transistor 18 according to some example embodiments, the cross-sectional view corresponding to line I-I' of FIG. 1. For clarity of illustration, substantially the same structures as those described with reference to FIGS. 1 and 2 may not be described here.

Referring to FIG. 11, the vertical type transistor 18 may be provided as follows. The vertical type transistor 18 may include a substrate 100, a first source/drain electrode layer 210, a second source/drain electrode layer 220, a gate electrode layer 300, a gate insulating film 430, a first spacer layer 410, a second spacer layer 420, a channel layer 500, a gap-fill film 602, and a passivation film 600. The substrate 100, the first source/drain electrode layer 210, the second source/drain electrode layer 220, the gate electrode layer 300, the gate insulating film 430, the first spacer layer 410, the second spacer layer 420, and the channel layer 500 may be substantially the same as those described with reference to FIGS. 1 and 2.

The gap-fill film 602 may be provided in a region surrounded by an inner surface of the channel layer 500. For example, the gap-fill film 602 may fill the region surrounded by the inner surface of the channel layer 500. A hole H may be filled with the channel layer 500 and the gap-fill film 602. The gap-fill film 602 may include an insulating material. For example, the gap-fill film 602 may include at least one of a silicon oxide, a silicon nitride, or a silicon oxynitride.

The passivation film 600 may be provided on the substrate 100. The passivation film 600 may cover the first source/drain electrode layer 210, the second source/drain electrode layer 220, the gate electrode layer 300, the gate insulating film 430, the first spacer layer 410, the second spacer layer 420, the channel layer 500, and the gap-fill film 602. The passivation film 600 may include an insulating material. For example, the passivation film 600 may include at least one of a silicon oxide, a silicon nitride, or a silicon oxynitride.

In some example embodiments, the passivation film 600 may include substantially the same material as the gap-fill film 602.

Some example embodiments may provide the vertical type transistor 18, which has the channel layer 500 extending in a third direction DR3 perpendicular to a top surface of the substrate 100.

Figure 12:
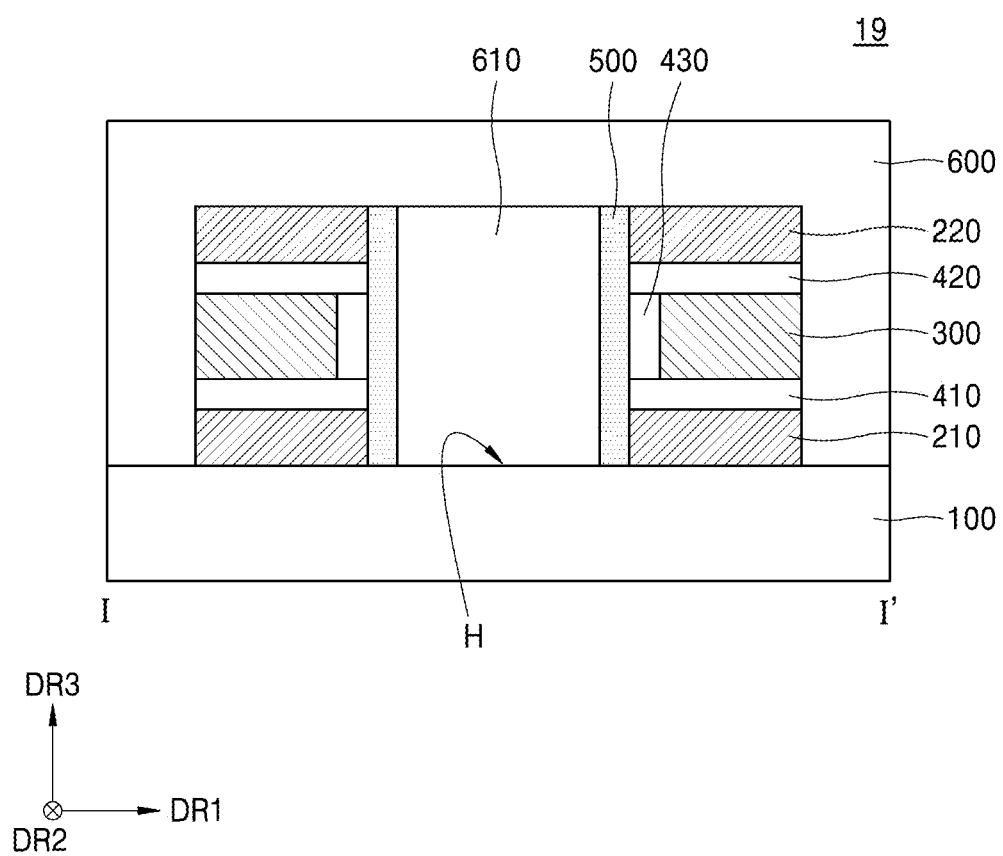
FIG. 12 is a cross-sectional view illustrating a vertical type transistor according to some example embodiments, the cross-sectional view corresponding to line I-I' of FIG. 1.

FIG. 12 is a cross-sectional view illustrating a vertical type transistor 19 according to some example embodiments, the cross-sectional view corresponding to line I-I' of FIG. 1. For clarity of illustration, substantially the same structures as those described with reference to FIGS. 1 and 2, or FIG. 11 may not be described here.

Referring to FIG. 12, the vertical type transistor 19 may be provided as follows. The vertical type transistor 19 may include a substrate 100, a first source/drain electrode layer 210, a second source/drain electrode layer 220, a gate electrode layer 300, a gate insulating film 430, a first spacer layer 410, a second spacer layer 420, a channel layer 500, and a passivation film 600. The substrate 100, the first source/drain electrode layer 210, the second source/drain electrode layer 220, the gate electrode layer 300, the gate insulating film 430, the first spacer layer 410, the second spacer layer 420, and the channel layer 500 may be substantially the same as those described with reference to FIGS. 1 and 2. The passivation film 600 may be substantially the same as the passivation film 600 described with reference to FIG. 11.

Unlike in example embodiments described with reference to FIG. 11, the vertical type transistor 19 may include a void 610. The void 610 may be a region which is not filled with a solid material and is surrounded by an inner surface of the channel layer 500. The void 610 may be formed according to conditions for a process of forming the passivation film 600. For example, conditions for an insulating material deposition process for forming the passivation film 600 may be controlled to deposit an insulating material outside a hole H (that is, on the second source/drain electrode layer 220). In other words, the insulating material may be prevented from being deposited in the hole H. When the insulating material is deposited such that the passivation film 600 covers the hole H, the void 610 may be formed among the passivation film 600, the substrate 100, and the channel layer 500. The void 610 may be filled with a gas, such as clean, dry air. Alternatively or additionally, the void 610 may be under pressure, e.g. may have a pressure lower than that of atmospheric pressure.

Some example embodiments may provide the vertical type transistor 18, which has the channel layer 500 extending in a third direction DR3 perpendicular to a top surface of the substrate 100.

Figure 13:
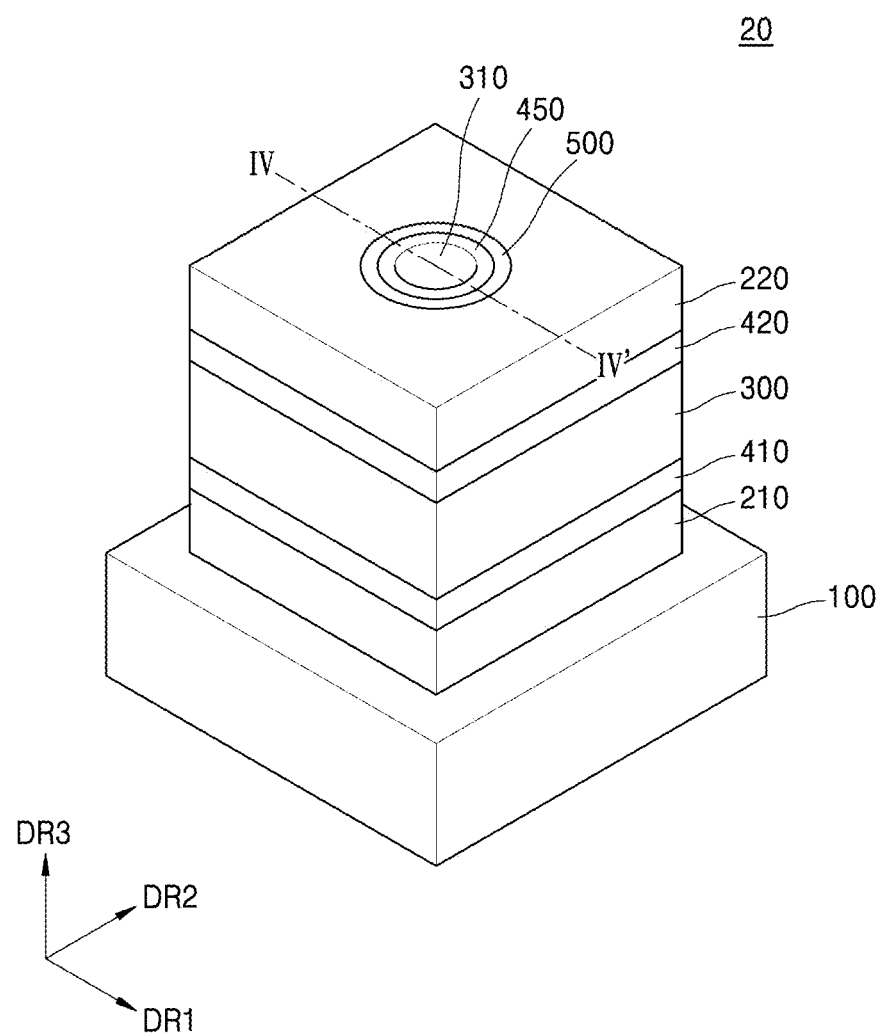
FIG. 13 is a perspective view illustrating a vertical type transistor according to some example embodiments.
Figure 14:
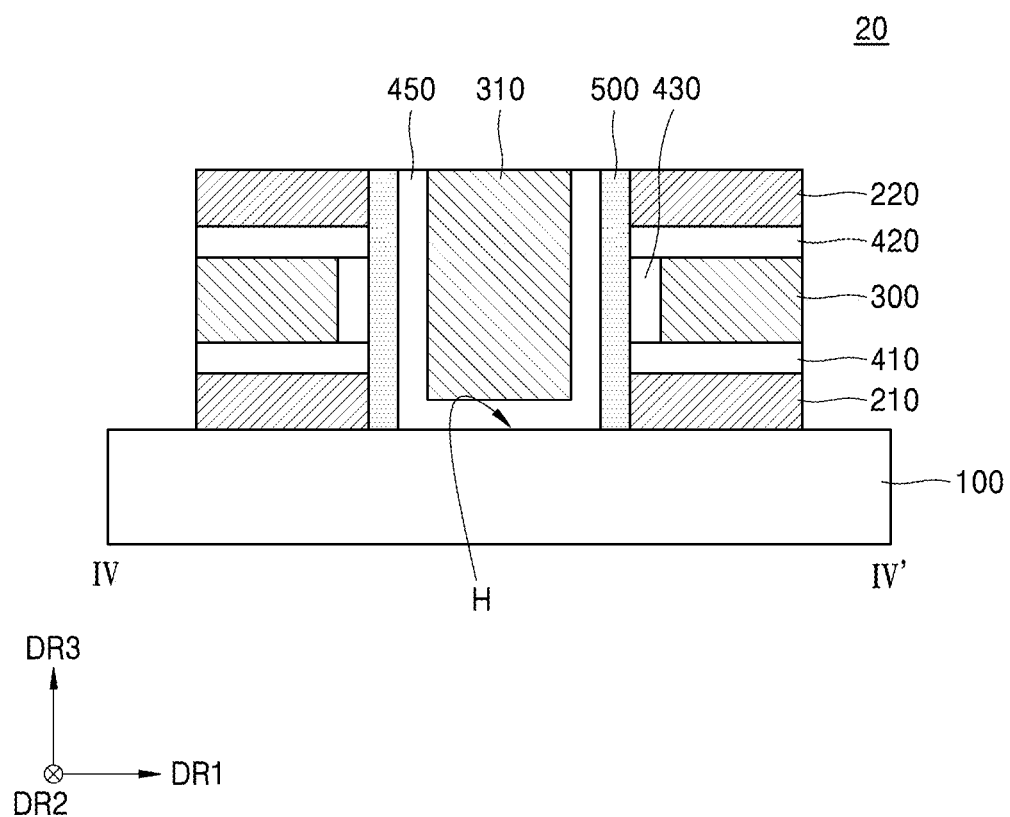
FIG. 14 is a cross-sectional view of the vertical type transistor, which is taken along line IV-IV' of FIG. 13.

FIG. 13 is a perspective view illustrating a vertical type transistor 20 according to some example embodiments. FIG. 14 is a cross-sectional view of the vertical type transistor 20, which is taken along line IV-IV' of FIG. 13. For clarity of illustration, substantially the same structures as those described with reference to FIGS. 1 and 2 may not be described here.

Referring to FIGS. 13 and 14, the vertical type transistor 20 may be provided as follows. The vertical type transistor 20 may include a substrate 100, a first source/drain electrode layer 210, a second source/drain electrode layer 220, a gate electrode layer 300, a gate insulating film 430, a first spacer layer 410, a second spacer layer 420, a channel layer 500, an additional gate electrode layer 310, and an additional gate insulating film 450. The substrate 100, the first source/drain electrode layer 210, the second source/drain electrode layer 220, the gate electrode layer 300, the gate insulating film 430, the first spacer layer 410, the second spacer layer 420, and the channel layer 500 may be substantially the same as those described with reference to FIGS. 1 and 2.

The additional gate insulating film 450 may be provided in a hole H. The additional gate insulating film 450 may have a portion extending along an inner surface of the channel layer 500. The additional gate insulating film 450 may have a portion which protrudes from the portion extending along the inner surface of the channel layer 500 and extends along a top surface of the substrate 100. For example, the additional gate insulating film 450 may conformally extend along the inner surface of the channel layer 500 and the top surface of the substrate 100. For example, the additional gate insulating film 450 may have a half-open tube shape. The additional gate insulating film 450 may include a dielectric material. For example, the additional gate insulating film 450 may include a high-k dielectric material.

The additional gate electrode layer 310 may be provided in the hole H. The additional gate electrode layer 310 may be provided in a region defined by an inner surface of the additional gate insulating film 450. For example, the additional gate electrode layer 310 may fill the region defined by the inner surface of the additional gate insulating film 450. The additional gate electrode layer 310 may be separated from the channel layer 500 by the additional gate insulating film 450. The additional gate electrode layer 310 may be electrically isolate, e.g. may electrically cut off from the channel layer 500. The additional gate electrode layer 310 may be separated from the substrate 100 by the additional gate insulating film 450.

The vertical type transistor 20 may include the gate electrode layer 300 and the additional gate electrode layer 310, which are separated from each other with the channel layer 500 therebetween.

Some example embodiments may provide the vertical type transistor 20, which has the channel layer 500 extending in a third direction DR3 perpendicular to the top surface of the substrate 100.

Figure 15:
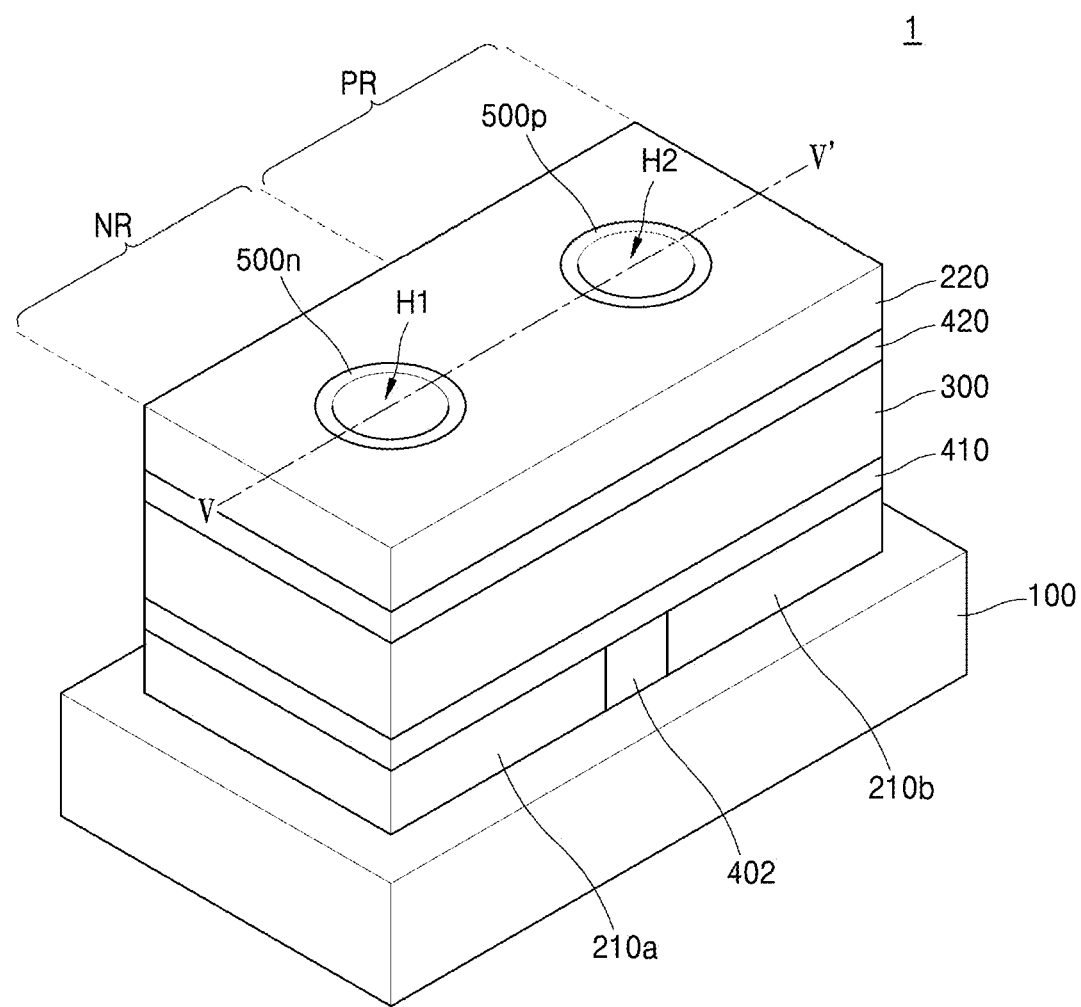
FIG. 15 is a perspective view illustrating a vertical type semiconductor device according to some example embodiments.
Figure 16:
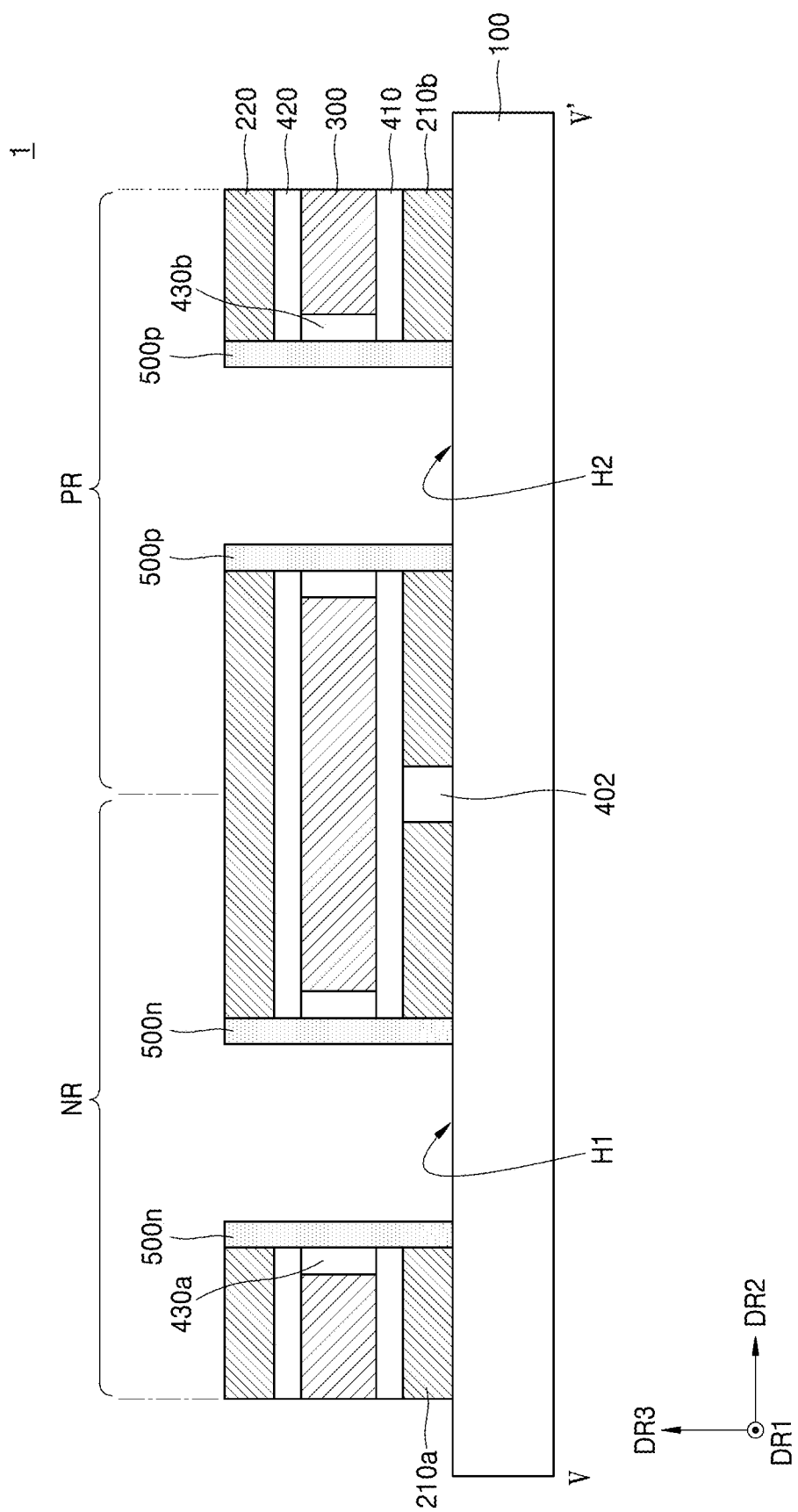
FIG. 16 is a cross-sectional view of the vertical type semiconductor device, which is taken along line V-V' of FIG. 15.

FIG. 15 is a perspective view illustrating a vertical type semiconductor device 1 according to some example embodiments. FIG. 16 is a cross-sectional view of the vertical type semiconductor device 1, which is taken along line V-V' of FIG. 15. For clarity of illustration, substantially the same structures as those described with reference to FIGS. 1 and 2 may not be described here.

Referring to FIGS. 15 and 16, the vertical type semiconductor device 1 may be provided as follows. The vertical type semiconductor device 1 may include a substrate 100, a first source electrode layer 210a, a second source electrode layer 210b, a drain electrode layer 220, a gate electrode layer 300, a source insulating film 402, a first gate insulating film 430a, a second gate insulating film 430b, a first spacer layer 410, a second spacer layer 420, an n-type channel layer 500n, and a p-type channel layer 500p. The n-type channel layer 500n may include, e.g. be doped with, impurities such, while the p-type channel layer 500p may include, e.g. be doped with, impurities. The impurities may be doped uniformly within the p-type channel layer 500p, or alternatively, portions of the p-type channel layer 500p may be more heavily doped than other portions of the p-type channel layer 500p. The n-type channel layer 500n may include or consist of an n-type 2D material, while the p-type channel layer 500p may include or consist of a p-type 2D material; however, example embodiments are not limited thereto. The impurities may be doped uniformly within the n-type channel layer 500n, or alternatively, portions of the n-type channel layer 500n may be more heavily doped than other portions of the p-type channel layer 500n. However, example embodiments are not limited thereto, and either or both of the n-type channel layer 500n and the p-type channel layer 500p may not include impurities. The substrate 100, the gate electrode layer 300, the first spacer layer 410, and the second spacer layer 420 may be substantially the same as those described with reference to FIGS. 1 and 2. Each of the first and second source electrode layers 210a and 210b, and the drain electrode layer 220 may be respectively and substantially the same as the first source/drain electrode layer 210 and the second source/drain electrode layer 220 described with reference to FIGS. 1 and 2.

The vertical type semiconductor device 1 may include an n-type region NR and a p-type region PR. The n-type region NR may be a region in which an n-type transistor is arranged. The p-type region PR may be a region in which a p-type transistor is arranged. The first source electrode layer 210a, the drain electrode layer 220, the gate electrode layer 300, the first gate insulating film 430a, the first spacer layer 410, and the second spacer layer 420 may be arranged in the n-type region NR. The second source electrode layer 210b, the drain electrode layer 220, the gate electrode layer 300, the second gate insulating film 430b, the first spacer layer 410, and the second spacer layer 420 may be arranged in the p-type region PR. The drain electrode layer 220, the gate electrode layer 300, the first spacer layer 410, and the second spacer layer 420 may be arranged in both the n-type region NR and the p-type region PR.

The source insulating film 402 may be provided between the first source electrode layer 210a and the second source electrode layer 210b. The source insulating film 402 may electrically isolate, e.g. may electrically cut the first source electrode layer 210a off from the second source electrode layer 210b. The source insulating film 402 may include an insulating material. For example, the source insulating film 402 may include at least one of a silicon oxide, a silicon nitride, or a silicon oxynitride. Each of the first gate insulating film 430a and the second gate insulating film 430b may be substantially the same as the gate insulating film 430 described with reference to FIGS. 1 and 2. The first gate insulating film 430a may be provided between the first source electrode layer 210a and the drain electrode layer 220. The second gate insulating film 430b may be provided between the second source electrode layer 210b and the drain electrode layer 220. The first and second gate insulating films 430a and 430b may be formed through the gate electrode layer 300. The first and second gate insulating films 430a and 430b may be apart from each other in a second direction DR2. The first gate insulating film 430a may be provided in the n-type region NR. The second gate insulating film 430b may be provided in the p-type region PR.

A first hole H1 may be provided on the substrate 100. The first hole H1 may be provided in the n-type region NR. The first hole H1 may be formed through the first source electrode layer 210a, the drain electrode layer 220, the first and second spacer layers 410 and 420, and the first gate insulating film 430a. The first hole H1 may be a region surrounded by lateral surfaces of the first source electrode layer 210a, the first and second spacer layers 410 and 420, and the first gate insulating film 430a. In some example embodiments, the lateral surfaces of the first source electrode layer 210a, the first and second spacer layers 410 and 420, and the first gate insulating film 430a, which are exposed through the first hole H1, may form a common surface. For example, the lateral surfaces of the first source electrode layer 210a, the first and second spacer layers 410 and 420, and the first gate insulating film 430a, which are exposed through the first hole H1, may extend in a third direction DR3. The first hole H1 may expose a top surface of the substrate 100.

A second hole H2 may be provided on the substrate 100. The second hole H2 may be provided in the p-type region PR. The second hole H2 may be formed through the second source electrode layer 210b, the first and second spacer layers 410 and 420, and the second gate insulating film 430b. The second hole H2 may be a region surrounded by lateral surfaces of the second source electrode layer 210b, the first and second spacer layers 410 and 420, and the second gate insulating film 430b. In some example embodiments, the lateral surfaces of the second source electrode layer 210b, the first and second spacer layers 410 and 420, and the second gate insulating film 430b, which are exposed through the second hole H2, may form a common surface. For example, the lateral surfaces of the second source electrode layer 210b, the first and second spacer layers 410 and 420, and the first gate insulating film 430a, which are exposed through the second hole H2, may extend in the third direction DR3. The second hole H2 may expose the top surface of the substrate 100. The second hole H2 may be apart from the first hole H1 in the second direction DR2.

The n-type channel layer 500n may be provided in the n-type region NR. The n-type channel layer 500n may be provided on a lateral side of the first hole H1. The lateral side of the first hole H1 may refer to the lateral surfaces of the first source electrode layer 210a, the first and second spacer layers 410 and 420, and the first gate insulating film 430a, which are exposed through the first hole H1. The n-type channel layer 500n may cover the lateral surfaces of the first source electrode layer 210a, the first and second spacer layers 410 and 420, and the first gate insulating film 430a, which are exposed through the first hole H1. The n-type channel layer 500n may extend along the lateral surfaces of the first source electrode layer 210a, the first and second spacer layers 410 and 420, and the first gate insulating film 430a, which are exposed through the first hole H1. For example, the n-type channel layer 500n may extend in the third direction DR3. The n-type channel layer 500n may expose the top surface of the substrate 100. For example, the n-type channel layer 500n may have an open-tube shape. The n-type channel layer 500n may include a 2D semiconductor. For example, the n-type channel layer 500n may include $MoS_2$. In an example, the 2D semiconductor included in the n-type channel layer 500n may have a monolayer structure. In an example, the 2D semiconductor included in the n-type channel layer 500n may have a multilayer structure. For example, the 2D semiconductor included in the n-type channel layer 500n may have a two-, three-, four-, or five-layer structure. The thickness of the n-type channel layer 500n may be determined as needed. For example, the thickness of the n-type channel layer 500n may be about 5 nanometers (nm) or less.

The p-type channel layer 500p may be provided in the p-type region PR. The p-type channel layer 500p may be provided on a lateral side of the second hole H2. The lateral side of the second hole H2 may refer to the lateral surfaces of the second source electrode layer 210b, the first and second spacer layers 410 and 420, and the second gate insulating film 430b, which are exposed through the second hole H2. The p-type channel layer 500p may cover the lateral surfaces of the second source electrode layer 210b, the first and second spacer layers 410 and 420, and the second gate insulating film 430b, which are exposed through the second hole H2. The p-type channel layer 500p may extend along the lateral surfaces of the second source electrode layer 210b, the first and second spacer layers 410 and 420, and the second gate insulating film 430b, which are exposed through the first hole H1. For example, the p-type channel layer 500p may extend in the third direction DR3. The p-type channel layer 500p may expose the top surface of the substrate 100. For example, the p-type channel layer 500p may have an open-tube shape. The p-type channel layer 500p may include a 2D semiconductor. For example, the p-type channel layer 500p may include $WSe_2$. In an example, the 2D semiconductor included in the p-type channel layer 500p may have a monolayer structure. In an example, the 2D semiconductor included in the p-type channel layer 500p may have a multilayer structure. For example, the 2D semiconductor included in the channel layer 500p may have a two-, three-, four-, or five-layer structure. For example, the thickness of the p-type channel layer 500p may be determined as needed. For example, the thickness of the p-type channel layer 500p may be about 5 nanometers (nm) or less.

In some example embodiments, the vertical type semiconductor device 1 may be or correspond to an inverter, such as a cross-coupled invert.

Some example embodiments may provide the vertical type semiconductor device 1 including the n-type channel layer 500n and the p-type channel layer 500p, which extend in the third direction DR3 perpendicular to the top surface of the substrate 100.

Figure 17:
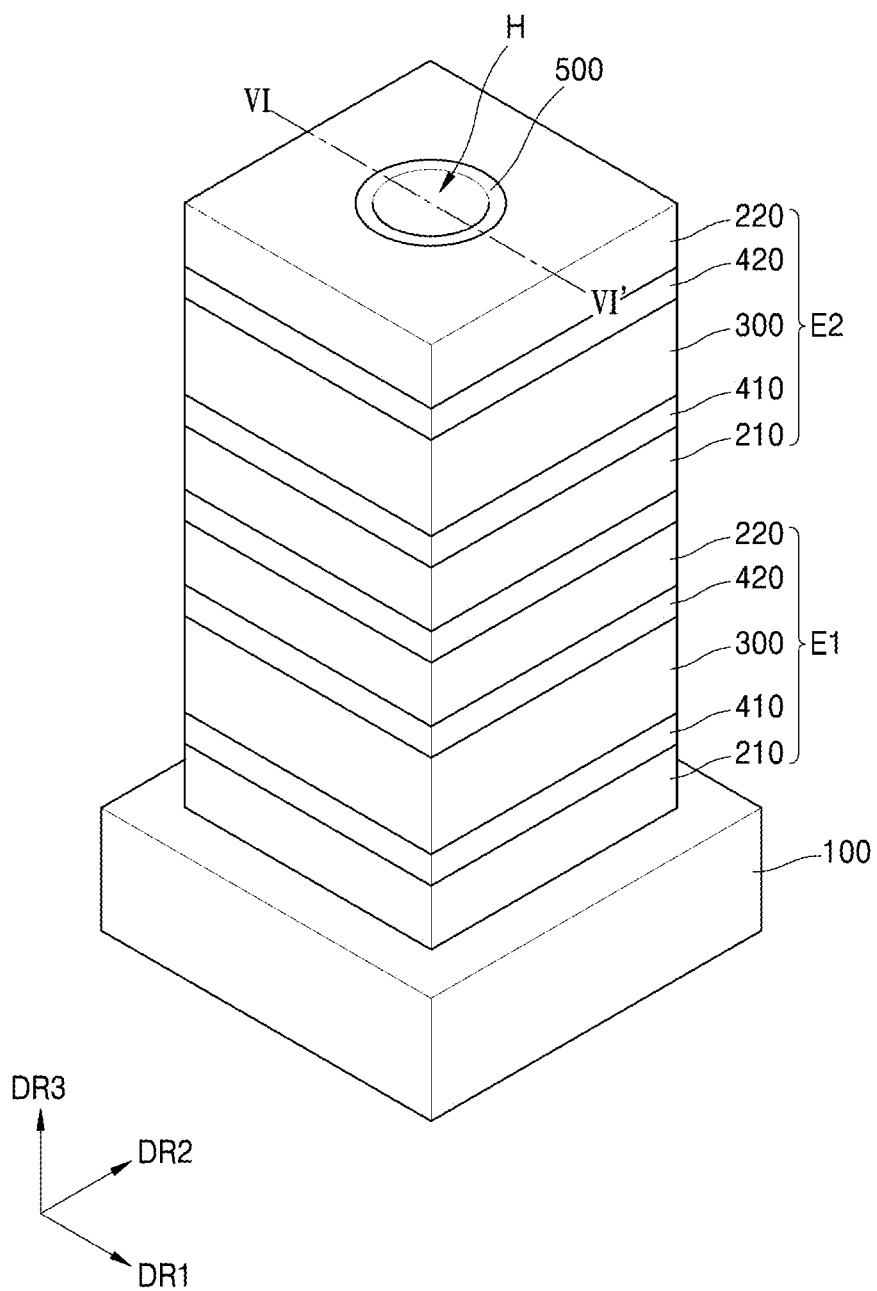
FIG. 17 is a perspective view illustrating a vertical type semiconductor device according to some example embodiments.
Figure 18:
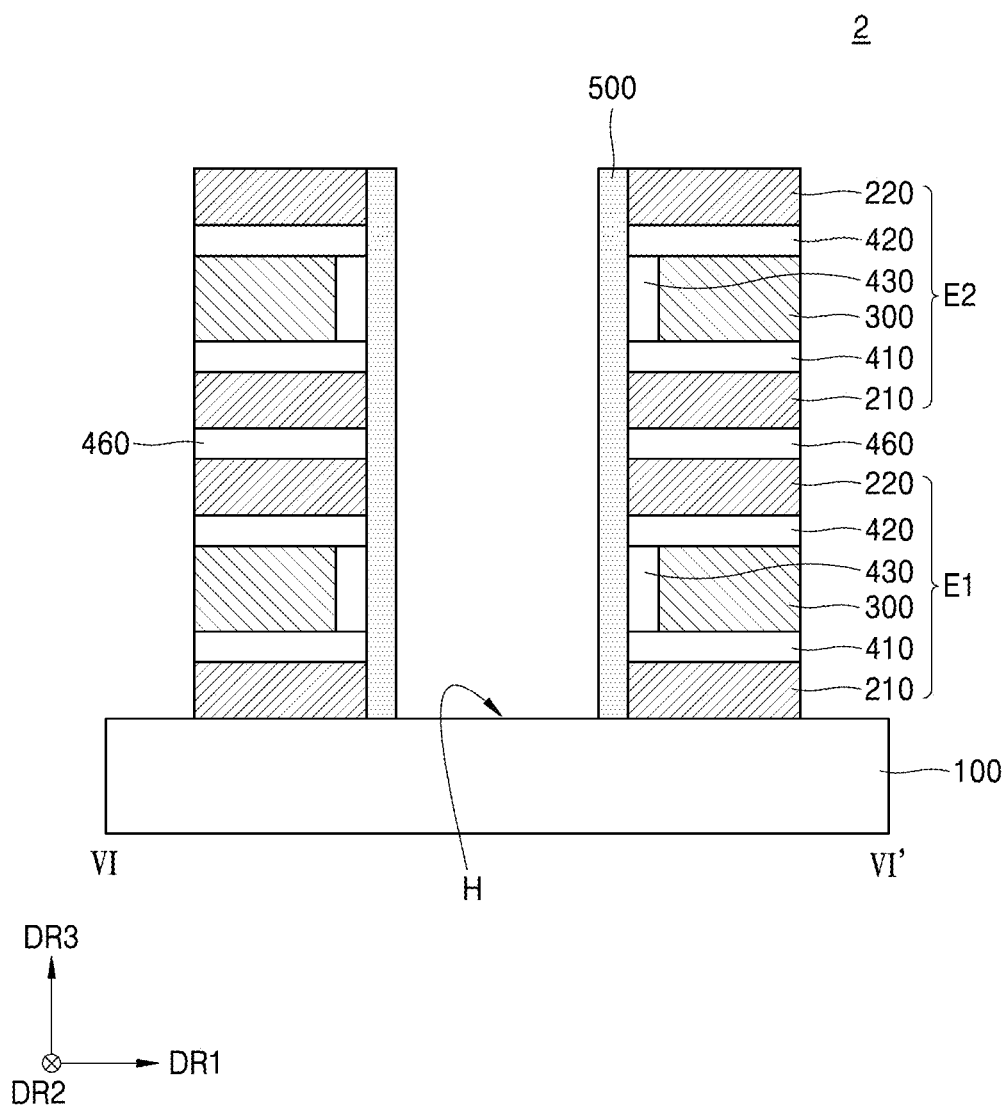
FIG. 18 is a cross-sectional view of the vertical type semiconductor device, which is taken along line VI-VI' of FIG. 17.

FIG. 17 is a perspective view illustrating a vertical type semiconductor device 2 according to some example embodiments. FIG. 18 is a cross-sectional view of the vertical type semiconductor device 2, which is taken along line VI-VI' of FIG. 17. For clarity of illustration, substantially the same structures as those described with reference to FIGS. 1 and 2 may not be described here.

Referring to FIGS. 17 and 18, the vertical type semiconductor device 2 may be provided as follows. The vertical type semiconductor device 2 may include a substrate 100, a lower transistor element E1, an interlayer insulating film 460, and an upper transistor element E2. Each of the lower transistor element E1 and the upper transistor element E2 may include a first source/drain electrode layer 210, a second source/drain electrode layer 220, a gate electrode layer 300, a gate insulating film 430, a first spacer layer 410, a second spacer layer 420, and a channel layer 500. The substrate 100, the first source/drain electrode layer 210, the second source/drain electrode layer 220, the gate electrode layer 300, the first spacer layer 410, and the second spacer layer 420 may be substantially the same as those described with reference to FIGS. 1 and 2.

The lower transistor element E1, the interlayer insulating film 460, and the upper transistor element E2 may be stacked on the substrate 100. The interlayer insulating film 460 may include an insulating material. For example, the interlayer insulating film 460 may include a silicon oxide, a silicon nitride, or a silicon oxynitride. The lower transistor element E1 and the upper transistor element E2 may be separated from each other by the interlayer insulating film 460. The second source/drain electrode layer 220 of the lower transistor element E1 may be electrically isolated, e.g. cut off from the first source/drain electrode layer 210 of the upper transistor element E2 by the interlayer insulating film 460.

A hole H may extend in a third direction DR3 to pass through the lower transistor element E1, the interlayer insulating film 460, and the upper transistor element E2. Lateral surfaces of the first source/drain electrode layer 210, the second source/drain electrode layer 220, the gate insulating film 430, the first spacer layer 410, and the second spacer layer 420 of each of the lower transistor element E1 and the upper transistor element E2, and a lateral surface of the interlayer insulating film 460 may be exposed through the hole H.

The channel layer 500 may be provided on a lateral side of the hole H. The channel layer 500 may extend along lateral surfaces of the lower transistor element E1, the interlayer insulating film 460, and the upper transistor element E2, which are exposed through the hole H.

Some example embodiments may provide the vertical type semiconductor device 2 including the channel layer 500, which extends in the third direction DR3 perpendicular to a top surface of the substrate 100.

Figure 19:
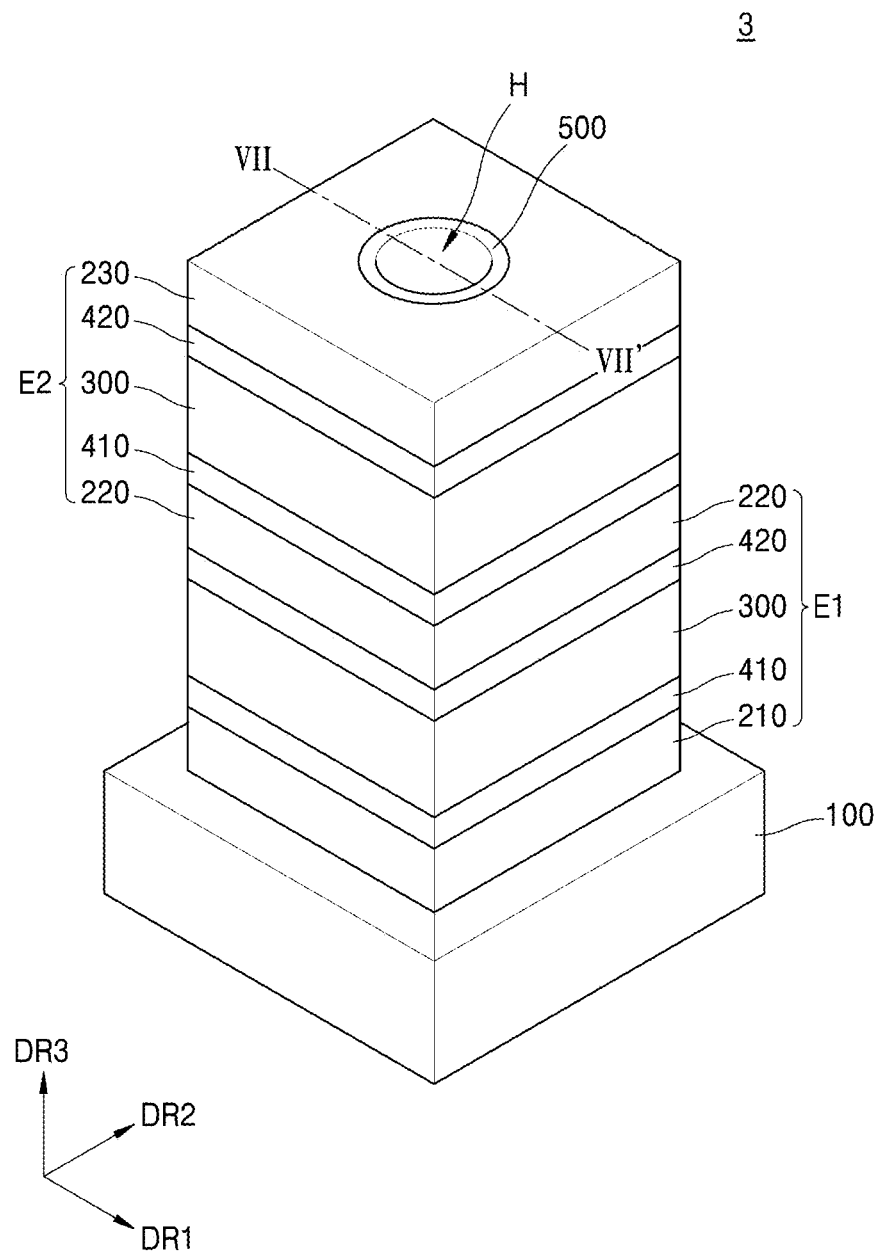
FIG. 19 is a perspective view illustrating a vertical type semiconductor device according to some example embodiments.
Figure 20:
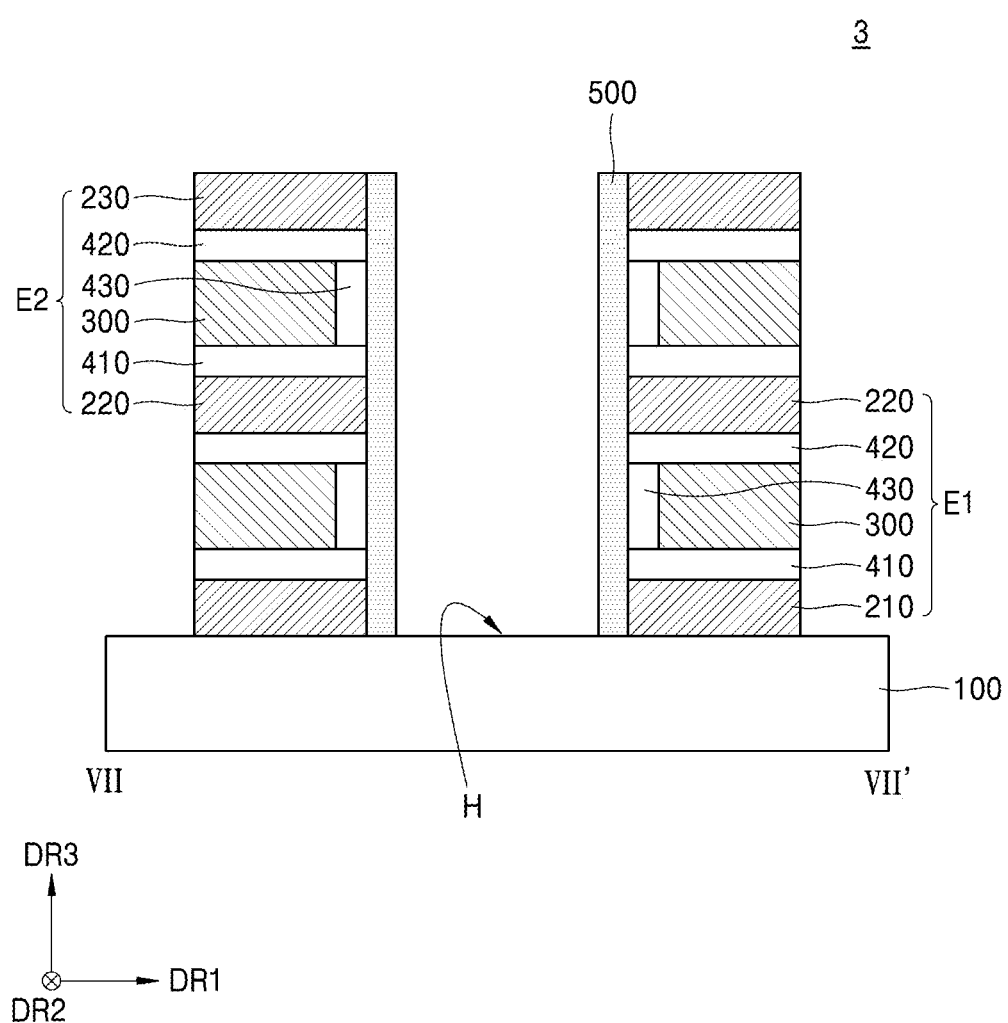
FIG. 20 is a cross-sectional view of the vertical type semiconductor device, which is taken along line VII-VII' of FIG. 19.

FIG. 19 is a perspective view illustrating a vertical type semiconductor device 3 according to some example embodiments. FIG. 20 is a cross-sectional view of the vertical type semiconductor device 3, which is taken along line VII-VII' of FIG. 19. For clarity of illustration, substantially the same structures as those described with reference to FIGS. 1 and 2, or FIGS. 17 and 18 may not be described here.

Referring to FIGS. 19 and 20, the vertical type semiconductor device 3 may be provided as follows. The vertical type semiconductor device 3 may include a substrate 100, a lower transistor element E1, and an upper transistor element E2. The lower transistor element E1 may include a first source/drain electrode layer 210, a second source/drain electrode layer 220, a gate electrode layer 300, a gate insulating film 430, a first spacer layer 410, a second spacer layer 420, and a channel layer 500. The upper transistor element E2 may include the second source/drain electrode layer 220, a third source/drain electrode layer 230, a gate electrode layer 300, a gate insulating film 430, a first spacer layer 410, a second spacer layer 420, and the channel layer 500. The substrate 100, the first source/drain electrode layer 210, the second source/drain electrode layer 220, the gate electrode layer 300, the first spacer layer 410, and the second spacer layer 420 may be substantially the same as those described with reference to FIGS. 1 and 2. The channel layer 500 may be substantially the same as the channel layer 500 described with reference to FIGS. 17 and 18.

Unlike in example embodiments described with reference to FIGS. 17 and 18, the upper transistor element E2 and the lower transistor element E1 may share the second source/drain electrode layer 220. For example, the second source/drain electrode layer 220 may function as a drain electrode of the upper transistor element E2 and a drain electrode of the lower transistor element E1.

Some example embodiments may provide the vertical type semiconductor device 3 including the channel layer 500, which extends in a third direction DR3 perpendicular to a top surface of the substrate 100.

Figure 21:
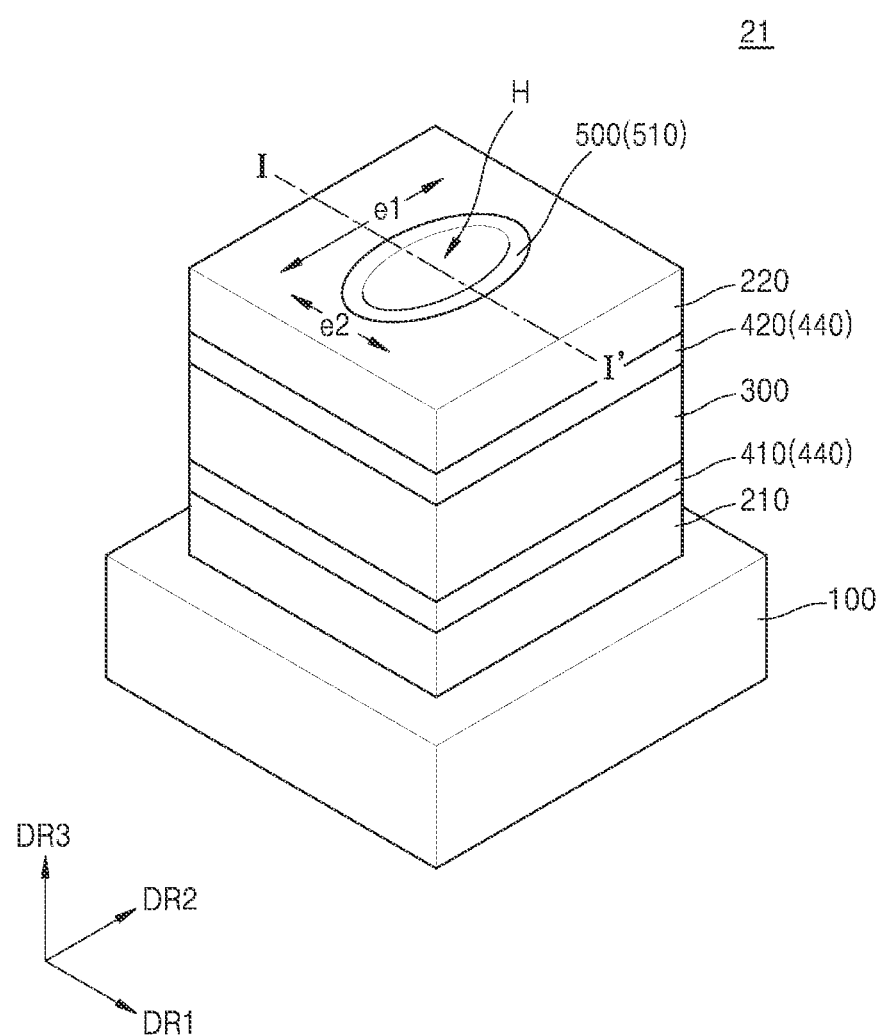
FIG. 21 is a perspective view illustrating a vertical type transistor according to some example embodiments.
Figure 22:
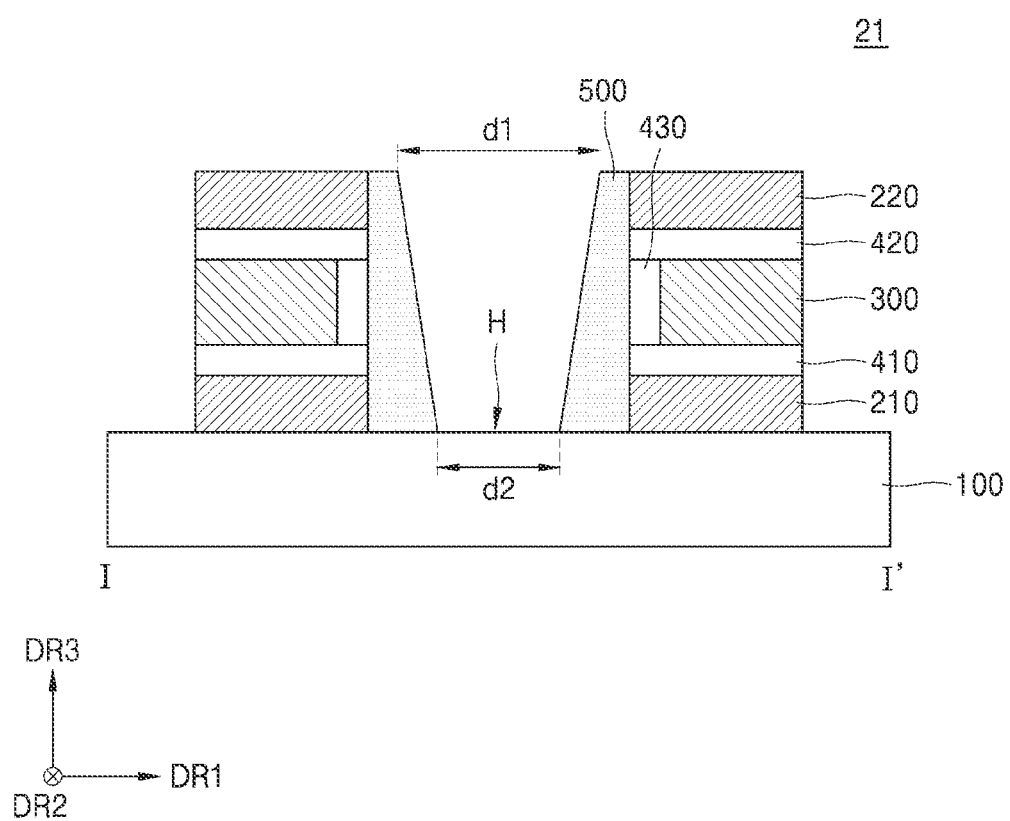
FIG. 22 is a cross-sectional view illustrating a vertical type transistor, the cross-sectional view corresponding to line I-I' of FIG. 21.

FIG. 21 is a perspective view illustrating a vertical type transistor 21 according to some example embodiments. FIG. 22 is a cross-sectional view of the vertical type transistor 21, which is taken along line I-I' of FIG. 21. For clarity of illustration, substantially the same structures as those described with reference to FIGS. 1 and 2 may not be described here.

Referring to FIGS. 21 and 22, the vertical type transistor 11 may be provided as follows.

Unlike in example embodiments described with reference to FIGS. 1 and 2, the hole H may have a shape in a plan view other than a circular shape. For example, as illustrated in FIG. 21, the shape of the hole H may be substantially elliptical, having a both a major axis e1 and a minor axis e2. The major axis e1 may be greater than the minor axis e2.

Alternatively, the shape of the hole H may be substantially polygonal, such as substantially quadrilateral; however example embodiments are not limited thereto.

Referring to FIG. 22, the hole H may not extend vertically downward towards the substrate 100. There may be an inclination, for example an inclination of the first channel layer 500. A length or diameter d1 of the hole H near a top of the hole H may be greater than a length or diameter d2 of the hole H near a bottom of the hole H.

Some example embodiments may provide the vertical type transistor 11, which have a non-cylindrical profile.

As described above, example embodiments may provide vertical type transistors including a 2D semiconductor.

Some example embodiments may provide inverters including a 2D semiconductor. Some example embodiments may provide other devices, for example static random access memory (SRAM) devices comprising a plurality of transistors, such as four n-type and two p-type, e.g. a six-transistor (6T) SRAM cell.

Some example embodiments may provide vertical type semiconductor devices including a 2D semiconductor.

Some example embodiments may have improved capabilities, e.g. improved electrical capabilities and/or improved ease of manufacturing or fabrication, by inclusion of 2D semiconductor materials into the channels of a vertical type gate-all-around (GAA) transistor.

However, effects of example embodiments are not limited thereto.

It should be understood that some example embodiments described herein should be considered in a descriptive sense only and not for purposes of limitation. Descriptions of features or aspects within each example embodiment should typically be considered as available for other similar features or aspects in other example embodiments, and are not to be construed as necessarily mutually exclusive to one another. While one or more example embodiments have been described with reference to the figures, it will be understood by those of ordinary skill in the art that various changes in form and details may be made therein without departing from the spirit and scope as defined by the following claims.

What is claimed is:

1. A vertical type transistor comprising:
a substrate;
a first source/drain electrode layer on the substrate;
a second source/drain electrode layer above the first source/drain electrode layer;
a first gate electrode layer between the first and second source/drain electrode layers;
a first gate insulating film on a lateral side of the first gate electrode layer; and
a first channel layer comprising a 2D semiconductor,
a passivation film on the second source/drain electrode layer, wherein
the first channel layer is on a lateral side of a hole, the hole passing through the second source/drain electrode layer, the first gate insulating film, and the first source/drain electrode layer, and
a void is in the hole between the passivation film and the substrate.

2. The vertical type transistor of claim 1, wherein the first channel layer extends from a lateral surface of the first source/drain electrode layer onto a lateral surface of the second source/drain layer, the first channel layer defining an annulus around the hole.

3. The vertical type transistor of claim 1, wherein the first source/drain electrode layer and the second source/drain electrode layer are electrically connected to the 2D semiconductor of the first channel layer in a direction of stacking of a plurality of stacked layers of the first channel layer.

4. The vertical type transistor of claim 2, wherein the first channel layer does not cover a bottom surface of the hole.

5. The vertical type transistor of claim 2, wherein the first channel layer covers a bottom surface of the hole.

6. The vertical type transistor of claim 1, wherein the first channel layer is between the first source/drain electrode layer and the second source/drain electrode layer.

7. The vertical type transistor of claim 6, wherein the first source/drain electrode layer and the second source/drain electrode layer are electrically connected to the 2D semiconductor of the first channel layer in a direction perpendicular to a stacking of a plurality of stacked layers of the first channel layer.

8. The vertical type transistor of claim 6, further comprising
a second channel layer on (A) a lateral surface of the first source/drain electrode layer exposed through the hole, (B) a lateral surface of the first channel layer exposed through the hole, and (C) a lateral surface of the second source/drain electrode layer exposed through the hole, wherein the second channel layer comprises a 2D semiconductor.

9. The vertical type transistor of claim 8, wherein the first source/drain electrode layer and the second source/drain electrode layer are electrically connected to the 2D semiconductor of the second channel layer in a direction of stacking of plurality of stacked layers of the first channel layer.

10. The vertical type transistor of claim 1, further comprising:
a lower spacer provided between the first source/drain electrode layer and the first gate electrode layer; and
an upper spacer between the second source/drain electrode layer and the first gate electrode layer,
wherein the lower spacer electrically isolates the first source/drain electrode layer from the first gate electrode layer, and
the upper spacer electrically isolates the second source/drain electrode layer from the first gate electrode layer.

11. The vertical type transistor of claim 10, wherein
the lower spacer extends between the first source/drain electrode layer and the first gate insulating film, and
the upper spacer extends between the second source/drain electrode layer and the first gate insulating film.

12. The vertical type transistor of claim 11, wherein the lower spacer, the first gate insulating film, and the upper spacer are a single structure.

13. The vertical type transistor of claim 10, wherein
the lower spacer and the upper spacer comprise the same insulating material, and
the first gate insulating film and the lower spacer comprise different insulating materials.

14. The vertical type transistor of claim 1, further comprising:
an inner insulating film filling the hole,
wherein the first channel layer surrounds the inner insulating film.

15. The vertical type transistor of claim 1, wherein the void is defined by (A) a bottom surface of the passivation film exposed by the hole, (B) a lateral surface of the first channel layer exposed by the hole, and (C) a top surface of the substrate exposed by the hole.

16. The vertical type transistor of claim 1, further comprising:
an additional gate electrode layer in the hole; and an additional gate insulating film between the additional gate electrode layer and the first channel layer.

17. The vertical type transistor of claim 16, wherein
the additional gate insulating film is between the additional gate electrode layer and the substrate, and
the additional gate electrode layer is separated from the substrate by the additional gate insulating film.

18. The vertical type transistor of claim 1, wherein the first channel layer comprises at least one of $MoS_2$, $MoSe_2$, $MoTe_2$, $WSe_2$, $WS_2$, $WTe_2$, $ReS_2$, $SnS_2$, $SnSe_2$, $PdSe_2$, $PtS_2$, $PtSe_2$, $HfS_2$, $HfSe_2$, $HfTe_2$, $TaS_2$, $TaSe_2$, $ZrS_2$, $ZrSe_2$, $ZrTe_2$, $As_2S_3$, $As_2Se_3$, $As_2Te_3$, $Sb_2S_3$, $Sb_2Se_3$, $Bi_2S_3$, $Bi_2Se_3$, $Bi_2Te_3$, GaS, GaSe, GaTe, GeS, GeSe, InSe, InTe, $TiS_3$, $TiBr_3$, $ZrS_3$, $ZrSe_3$, $ZrTe_3$, black phosphorus, or phosphorene.

19. The vertical type transistor of claim 1, wherein the first channel layer has a thickness of less than or equal to about 5 nanometers (nm).

20. An inverter comprising:
a substrate;
an n-type transistor on the substrate; and
a p-type transistor on the substrate,
wherein each of the n-type transistor and the p-type transistor includes,
a source electrode layer,
a drain electrode layer above the source electrode layer,
a gate electrode layer between the source electrode layer and the drain electrode layer,
a gate insulating film on a lateral sidewall of the gate electrode layer, and
a first channel layer comprising a 2D semiconductor,
a passivation film on the drain electrode layer, wherein
the first channel layer is on a lateral side of a hole passing through the drain electrode layer, the gate insulating film, and the source electrode layer,
the drain electrode layer of the n-type transistor and the drain electrode layer of the p-type transistor are electrically connected to each other, and
the source electrode layer of the n-type transistor and the source electrode layer of the p-type transistor are electrically isolated from each other, and
a void is in the hole between the passivation film and the substrate.

21. The inverter of claim 20, wherein
the first channel layer of the n-type transistor comprises an n-type 2D semiconductor, and
the first channel layer of the p-type transistor comprises a p-type 2D semiconductor.

22. The inverter of claim 20, wherein, in at least one of the n-type transistor or the p-type transistor, the first channel layer extends from a lateral surface of the source electrode layer onto a lateral surface of the drain electrode layer, the first channel layer defining an annulus around the hole.

23. The inverter of claim 22, wherein, in the at least one of the n-type transistor and the p-type transistor, the source electrode layer and the drain electrode layer are electrically connected to the 2D semiconductor of the first channel layer in a direction of stacking of a plurality of stacked layers of the first channel layer.

24. The inverter of claim 20, wherein, in at least one of the n-type transistor and the p-type transistor, the first channel layer is between the source electrode layer and the drain electrode layer.

25. The inverter of claim 24, wherein, in the at least one of the n-type transistor and the p-type transistor, the source electrode layer and the drain electrode layer are electrically connected to the 2D semiconductor of the first channel layer in a direction perpendicular to stacking of a plurality of stacked layers of the first channel layer.

26. The inverter of claim 24, wherein,
at least one of the n-type transistor and the p-type transistor further comprises a second channel layer on (A) a lateral surface of the source electrode layer exposed through the hole, (B) a lateral surface of the first channel layer exposed through the hole, and (C) a lateral surface of the drain electrode layer exposed through the hole, and
the second channel layer comprises a 2D semiconductor.

27. The inverter of claim 26, wherein, in the at least one of the n-type transistor and the p-type transistor, the source electrode layer and the drain electrode layer are electrically connected to the 2D semiconductor of the second channel layer in a direction of stacking of a plurality of stacked layers of the first channel layer.

28. The inverter of claim 20, further comprising:
a source insulating film between the source electrode layer of the n-type transistor and the source electrode layer of the p-type transistor,
wherein the source electrode layer of the n-type transistor and the source electrode layer of the p-type transistor are electrically isolated from each other by the source insulating film.

29. The inverter of claim 20, wherein the drain electrode layer of the n-type transistor and the drain electrode layer of the p-type transistor are a single structure.

30. A vertical type semiconductor device comprising:
a substrate;
a lower transistor on the substrate;
an upper transistor above the lower transistor; and
a first channel layer passing through the lower transistor and the upper transistor,
wherein each of the lower transistor and the upper transistor includes,
a lower source/drain electrode layer,
an upper source/drain electrode layer above the lower source/drain electrode layer,
a gate electrode layer provided between the lower source/drain electrode layer and the upper source/drain electrode layer, and
a gate insulating film passing through the gate electrode layer,
wherein the first channel layer comprises a 2D semiconductor, and the first channel layer passes through the gate insulating film of the lower transistor and the gate insulating film of the upper transistor.

31. The vertical type semiconductor device of claim 30, wherein the first channel layer extends from a lateral surface of the lower source/drain electrode layer of the lower transistor onto a lateral surface of the upper source/drain electrode layer of the upper transistor.

32. The vertical type semiconductor device of claim 31, wherein, in each of the lower transistor and the upper transistor, the lower source/drain electrode layer and the upper source/drain electrode layer are electrically connected to the 2D semiconductor of the first channel layer in a direction of stacking of a plurality of stacked layers of the first channel layer.

33. The vertical type semiconductor device of claim 30, wherein
at least one of the lower transistor and the upper transistor further comprises a second channel layer between the gate insulating film and the first channel layer, and
the second channel layer comprises a 2D semiconductor.

34. The vertical type semiconductor device of claim 33, wherein the lower source/drain electrode layer and the upper source/drain electrode layer, are electrically connected to the 2D semiconductor of the second channel layer in a direction perpendicular to a stacking of a plurality of stacked layers of the first channel layer, and
the lower source/drain electrode layer and the upper source/drain electrode layer are immediately adjacent to the second channel layer.

35. The vertical type semiconductor device of claim 30, further comprising:
an interlayer insulating film between the upper source/drain electrode layer of the lower transistor and the lower source/drain electrode layer of the upper transistor,
wherein the upper source/drain electrode layer of the lower transistor and the lower source/drain electrode layer of the upper transistor are electrically isolated from each other by the interlayer insulating film.

36. The vertical type semiconductor device of claim 30, wherein the upper source/drain electrode layer of the lower transistor and the lower source/drain electrode layer of the upper transistor are a single electrode layer.

37. A vertical type transistor comprising:
a drain electrode on a substrate;
a gate electrode on the drain electrode;
a gate insulating film on a lateral side of the gate electrode; and
a vertical channel layer comprising a 2D semiconductor, wherein
the vertical channel layer is on a lateral side of a hole passing through the gate insulating film and the drain electrode,
a top and a bottom of the hole are covered, and the hole has a void that is not filled with a solid material.

38. The vertical type transistor of claim 37, wherein, when viewed in a plan-view, the hole has a non-circular shape.

39. The vertical type transistor of claim 37, wherein, when viewed in a cross-sectional view, the hole has a tapered profile.

40. The vertical type transistor of claim 37, wherein, the hole has a non-cylindrical shape.

* * * * *